(12) United States Patent
Kawamura et al.

(10) Patent No.: US 10,126,618 B2
(45) Date of Patent: Nov. 13, 2018

(54) DISPLAY DEVICE AND MANUFACTURING METHOD OF THE DISPLAY DEVICE

(71) Applicant: Panasonic Liquid Crystal Display Co., Ltd., Hyogo (JP)

(72) Inventors: Tetsuya Kawamura, Hyogo (JP); Tetsurou Izawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 83 days.

(21) Appl. No.: 15/185,358

(22) Filed: Jun. 17, 2016

(65) Prior Publication Data

US 2016/0300854 A1 Oct. 13, 2016

Related U.S. Application Data

(63) Continuation of application No. PCT/JP2014/000936, filed on Feb. 21, 2014.

(30) Foreign Application Priority Data

Dec. 19, 2013 (JP) ................................. 2013-262323

(51) Int. Cl.
*G02F 1/1362* (2006.01)
*H01L 27/12* (2006.01)
*G09G 3/36* (2006.01)

(52) U.S. Cl.
CPC .. *G02F 1/136286* (2013.01); *G02F 1/136227* (2013.01); *H01L 27/124* (2013.01);
(Continued)

(58) Field of Classification Search
CPC ............... H01L 27/124; H01L 27/1262; H01L 27/3276; H01L 27/3297; H01L 2021/775;
(Continued)

(56) References Cited

U.S. PATENT DOCUMENTS

2005/0062898 A1* 3/2005 Imayama .......... G02F 1/133345
349/43
2006/0138461 A1 6/2006 Abe et al.
(Continued)

FOREIGN PATENT DOCUMENTS

| JP | 2005-91962 | 4/2005 |
|---|---|---|
| JP | 2009-115940 | 5/2009 |
| JP | 2012-32608 | 2/2012 |

OTHER PUBLICATIONS

International Search Report dated Apr. 22, 2014 in corresponding International Application No. PCT/JP2014/000936.

*Primary Examiner* — Edward Glick
*Assistant Examiner* — Shan Liu
(74) *Attorney, Agent, or Firm* — Wenderoth, Lind & Ponack, L.L.P.

(57) ABSTRACT

A display device displaying an image in a display area in accordance with image signals. The display device includes an insulating substrate, a gate line extending in a first direction on the insulating substrate, a source line extending in a second direction which is different from the first direction on the insulating substrate, a lead-out line extending in the second direction so as to transmit gate signals to the gate line. Additionally, a first conductive portion covers at least a part of the gate line and at least a part of the lead-out line, a gate connecting portion connects the gate line and the first conductive portion and a lead-out connecting portion connects the lead-out line and the first conductive portion.

14 Claims, 25 Drawing Sheets

(52) U.S. Cl.
CPC ....... *H01L 27/1262* (2013.01); *G09G 3/3648* (2013.01); *G09G 2300/0426* (2013.01)

(58) Field of Classification Search
CPC ............. H01L 27/1214; H01L 27/2436; H01L 29/66037; H01L 29/66068; H01L 29/66227; H01L 29/72; H01L 29/786; H01L 2924/1304; H01L 51/0504; H01L 51/0508; H01L 27/1251; H01L 29/78666; H01L 29/78675; H01L 23/48; H01L 23/49572; H01L 2224/50; H01L 2224/79; H01L 2224/86; H01L 2225/06579; H01L 2225/107; H01L 24/50; G02F 1/0316; G02F 1/1343; G02F 1/134309; G02F 1/13439; G02F 1/136286; G02F 1/155; G02F 1/1393; G02F 1/1395; G02F 2001/1357; G02F 2001/136218; G02F 2001/136295; G02F 2001/1552; G02F 2001/1555; G02F 2001/1557; G02F 2201/12; G02F 2201/121; G02F 1/1362; G02F 1/136209; G02F 1/136227; G02F 1/1365; G02F 1/1368; G02F 2001/136222; G02F 2001/136231; G02F 2001/13625; G02F 2001/1635; G02F 2201/122; G02F 2202/10; G02F 1/343; G02F 2001/13685; G02F 1/0121; G02F 1/0327; G02F 1/076; G02F 1/133; G02F 1/13306; G02F 1/1345; G02F 1/13452; G02F 1/13454; G02F 1/13458; G02F 2001/133388; G02F 2001/133612; G02F 2001/13456; G09G 3/3648; G09G 2300/0426; G09G 2300/0421; G09G 3/3659; G09G 2300/0408; G09G 3/3655; G09G 3/3674; G09G 3/3685; G09G 2290/00; G09G 2320/0223; G09G 3/36
USPC .......................... 349/42–43, 46–47, 149–152
See application file for complete search history.

(56) References Cited

U.S. PATENT DOCUMENTS

| | | | | |
|---|---|---|---|---|
| 2007/0146611 | A1* | 6/2007 | Kang | G02F 1/13452 349/149 |
| 2008/0024416 | A1* | 1/2008 | Onogi | G02F 1/134363 345/92 |
| 2009/0040166 | A1* | 2/2009 | Lee | G02F 1/1345 345/98 |
| 2010/0066967 | A1* | 3/2010 | Takahashi | G02F 1/1345 349/143 |
| 2010/0140610 | A1* | 6/2010 | Lee | H01L 27/1225 257/43 |
| 2011/0080549 | A1* | 4/2011 | Jung | G02F 1/1343 349/141 |
| 2011/0279418 | A1* | 11/2011 | Han | G02F 1/136286 345/204 |
| 2012/0026420 | A1 | 2/2012 | Saitoh | |
| 2014/0152938 | A1* | 6/2014 | Lee | G09G 3/3648 349/46 |
| 2014/0319527 | A1* | 10/2014 | Shin | H01L 27/124 257/59 |
| 2014/0375534 | A1* | 12/2014 | Lee | G09G 3/3648 345/87 |
| 2015/0076501 | A1* | 3/2015 | Hayashi | H01L 27/124 257/72 |
| 2015/0162358 | A1* | 6/2015 | Inoue | H01L 27/1225 257/43 |
| 2015/0187309 | A1* | 7/2015 | Kim | G09G 3/3659 345/99 |

* cited by examiner

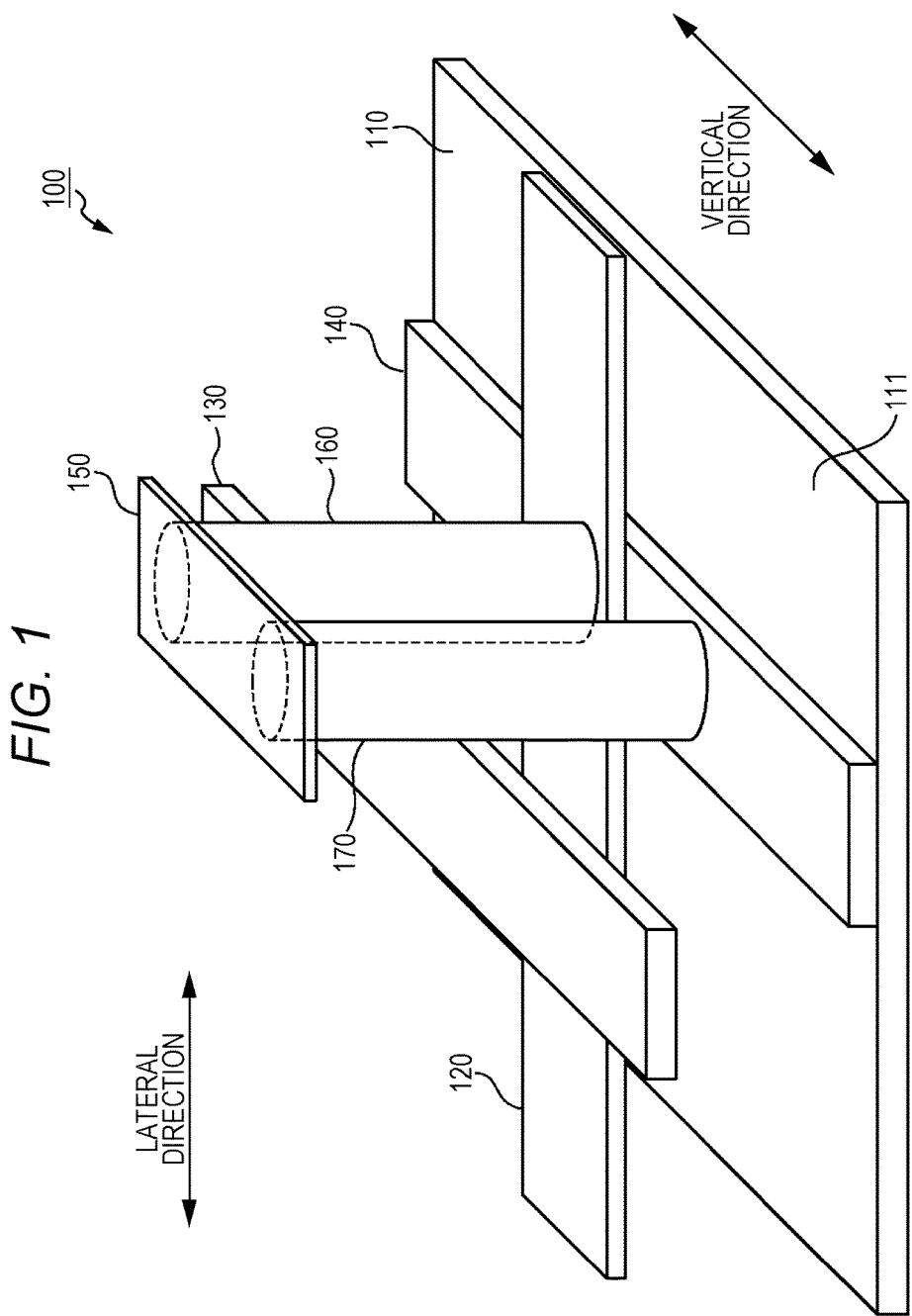

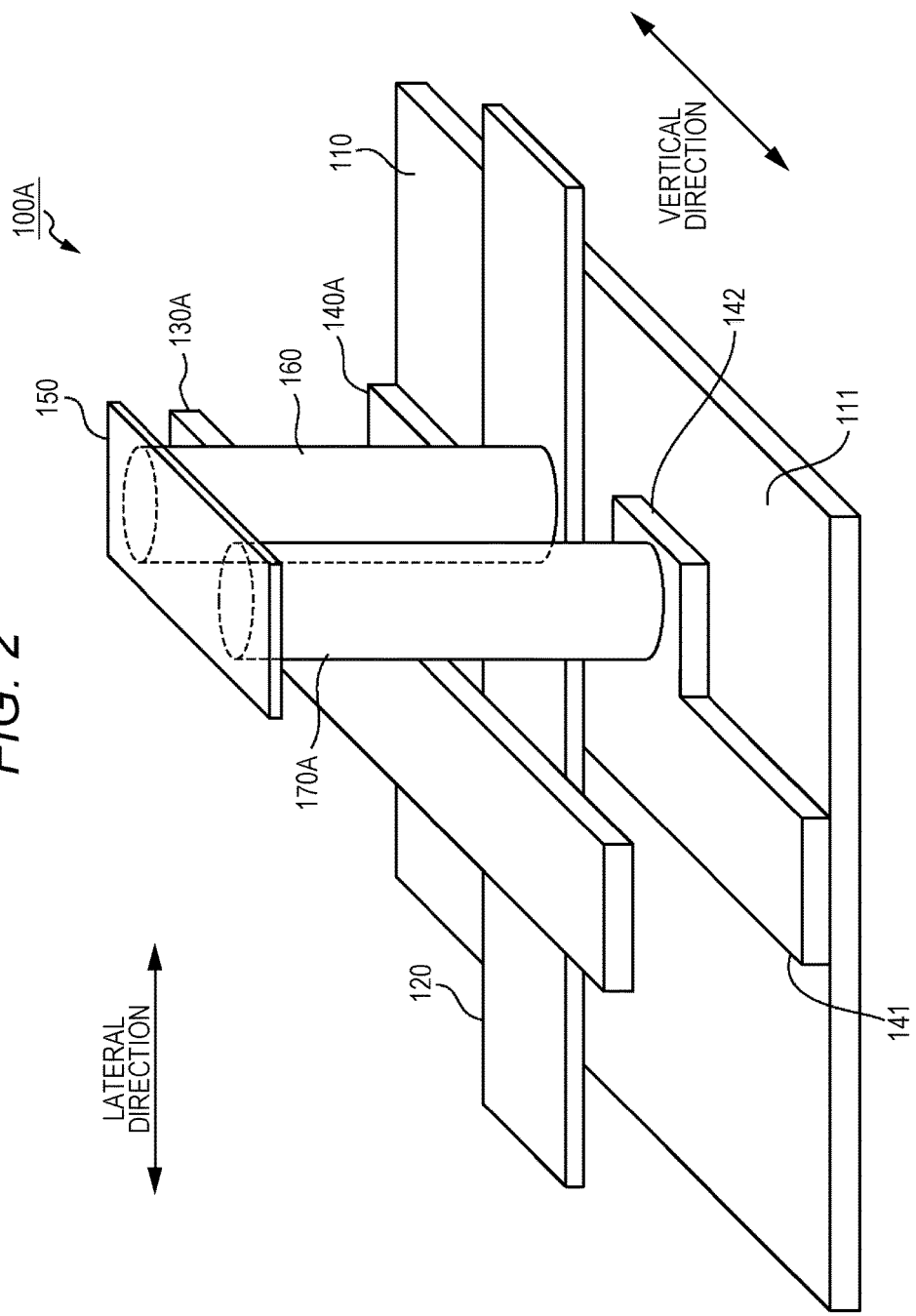

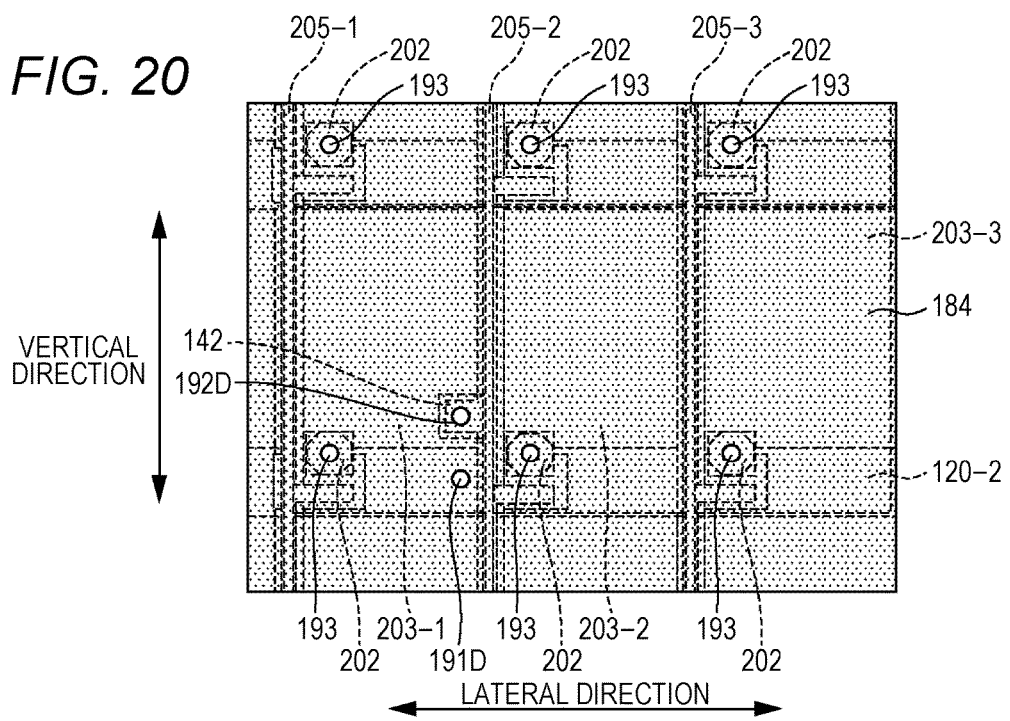
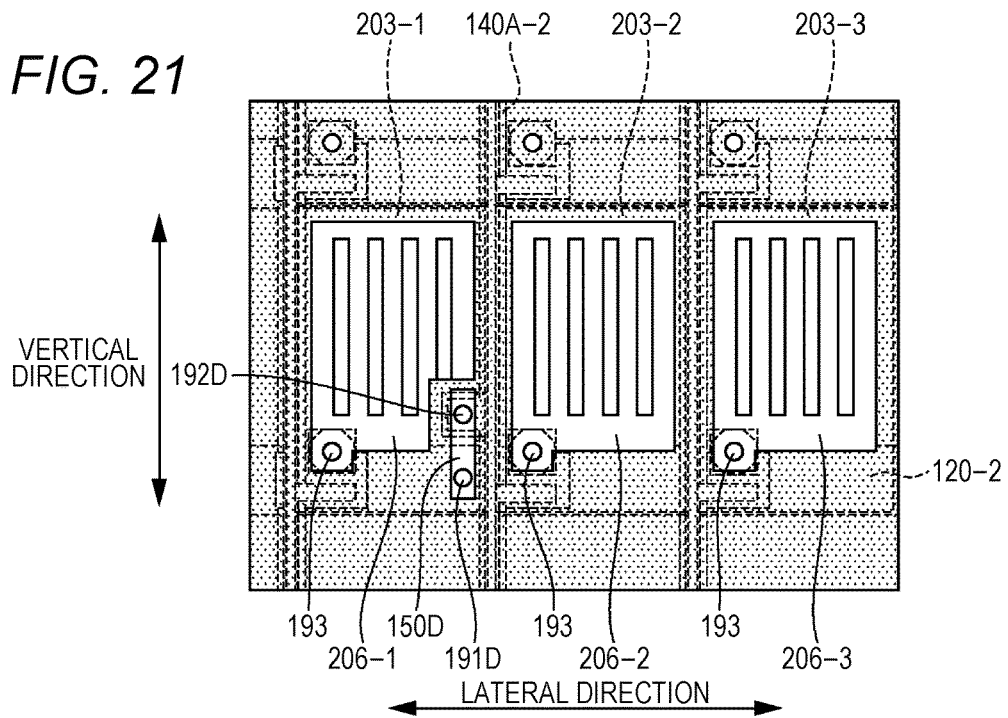

DISPLAY DEVICE AND MANUFACTURING METHOD OF THE DISPLAY DEVICE

CROSS-REFERENCE TO RELATED APPLICATION

This application is bypass continuation of international patent application PCT/JP2014/000936, filed Feb. 21, 2014 designating the United States of America, the entire disclosure of which is incorporated herein by reference. Priority is claimed based on Japanese patent application JP 2013-262323, filed Dec. 19, 2013, the entire disclosure of which is incorporated herein by reference in its entirety.

TECHNICAL FIELD

This disclosure relates to a manufacturing process of display devices displaying image.

BACKGROUND

A liquid crystal display device generally includes an outer substrate and an inner substrate. The outer substrate includes a display area which displays images. The inner substrate faces the outer substrate. The display device further includes wiring portion, a gate driver and a source driver. The wiring portion includes gate lines, source lines and pixels. The gate driver emits gate signals to the gate lines. The source driver emits source signals to the source lines as image signals. The pixels adjust light according to gate signals and source signals and can cause viewers to view images on the display area.

The gate driver and the source driver are provided on the inner substrate. The wiring portion and the display area are formed in an overlapping area where the outer substrate and the inner substrate overlap. The gate driver and the source driver are located in outside of the overlapping area.

A prior art discloses that gate drivers and source drivers are disposed adjacent to four side of a rectangular shape of the overlapping area. Techniques of disposing the gate drivers and the source drivers disclosed in the prior art may require the inner substrate having a longer side in both a longitudinal and a lateral direction. It may make a ratio of an area of the display area to a whole area of the display device small. It may conflict to needs of consumers who desire a big display area on a small display device (See Japanese Unexamined Patent Application Publication No. 2012-32608).

Research about wiring structures has been conducted to fill the needs of consumers who desire a big display area on a small display. However, these wiring structures confront a problem caused by too many manufacturing steps.

SUMMARY

An object of the present disclosure is to provide a method for manufacturing a display device manufactured by a small number of manufacturing steps and a display device manufactured thereby.

In one general aspect, the instant application describes a display device displaying an image in a display area in accordance with image signals. The display device includes an insulating substrate, agate line extending in a first direction on the insulating substrate, a source line extending in a second direction which is different from the first direction on the insulating substrate, a lead-out line extending in the second direction so as to transmit gate signals to the gate line, a first conductive portion covering at least apart of the gate line and at least a part of the lead-out line, a gate connecting portion connecting the gate line and the first conductive portion and a lead-out connecting portion connecting the lead-out line and the first conductive portion.

In another general aspect, a method for manufacturing a display device displaying an image in a display area in accordance with image signals. The display device may include a gate line extending in a first direction, a source line extending in a second direction which is different from the first direction, and a lead-out line extending in the second direction. The method may include an insulating step for forming insulating layers to insulate the gate line, the source line, and the lead-out line from each other, a through-hole step for forming a first through hole and a second through hole in the insulating layers at a same time, the first through hole running towards the gate line and a second through-hole running towards the lead-out line, and a connecting step for providing conductive member into the first through hole and the second through hole and electrically connecting between the gate line and the lead-out lines through the first conductive portion by laminating the first conductive portion on the insulating layers.

These implementations can provide a display device which can be manufactured by a small number of manufacturing steps.

Objects, features, and advantages of the present disclosure will become more apparent from the following detailed description and the appended drawings.

BRIEF DESCRIPTION OF THE DRAWINGS

FIG. 1 is a schematic perspective view of a display device in a first embodiment.

FIG. 2 is a schematic perspective view of a display device in a second embodiment.

FIG. 3 B is another schematic cross-sectional view of the display device in FIG. 3 A.

FIG. 4 B is another schematic cross-sectional view of the display device in FIG. 4 A.

FIG. 5 B is a schematic cross-sectional view of the display device in FIG. 3 B (fifth embodiment).

FIG. 6 B is a schematic cross-sectional view of the display device in FIG. 3 B (fifth embodiment).

FIG. 7 B is a schematic cross-sectional view of the display device in FIG. 3 B (fifth embodiment).

FIG. 8 B is a schematic cross-sectional view of the display device in FIG. 4 B (sixth embodiment).

FIG. 9 B is a schematic cross-sectional view of the display device in FIG. 4 B (sixth embodiment).

FIG. 20 is a schematic view of a forming process of a fourth insulating layer in the laminating process shown in FIG. 11.

FIG. 21 is a schematic view of a forming process of pixel electrodes layer in the laminating process shown in FIG. 11.

FIG. 22 B is a schematic cross-sectional view of a display device manufactured according to the flow chart in FIG. 11.

FIG. 23 B is another schematic cross-sectional view of the display device in FIG. 23 A.

FIG. 25 B is another schematic cross-sectional view of the display device in FIG. 25 A.

FIG. 27 B is another schematic cross-sectional view of the display device in FIG. 27 A.

FIG. 29 B is other schematic cross-sectional view of the display device in FIG. 29 A.

DETAILED DESCRIPTION

Figure 3A:
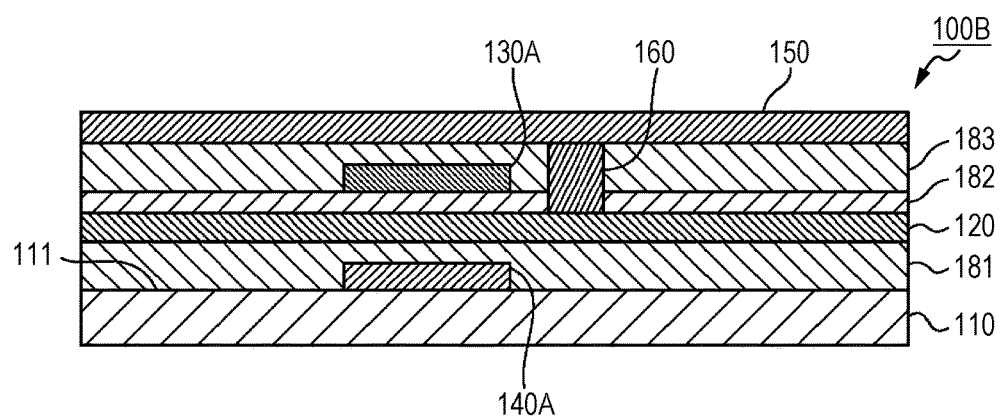
FIG. 3 A is a schematic cross-sectional view of a display device in a third embodiment.

With reference to attached drawings, various embodiments regarding display devices displaying image are described below. The display devices can be recognized with the following explanations clearly. The directional term referring to a direction such as "top", "bottom", "left" and "right" is merely used to clarify the explanation. Therefore, these terms should not be interpreted restrictively.

[First Embodiment]

If gate signals are output in the same direction as source signals, both of a source driver outputting source signals and a gate driver outputting gate signals concentrate on a specific area in a display device. This allows a large display area to be formed. If source lines transmitting source signals and gate lines transmitting gate signals are formed between conductive portions and an insulating substrate, and the conductive portions are used to transmit gate signals, a process step for connecting the conductive portions to gate lines and a process step for connecting the conductive portions and lead-out lines are carried out at the same time. As a result, display devices can be manufactured by a small number of manufacturing steps.

FIG. 1 is a schematic perspective view of a display device 100 in the first embodiment. With reference to FIG. 1, the display device 100 is described.

The display device 100 includes an insulating substrate 110, a gate line 120, a source line 130, a lead-out line 140, a conductive portion 150, a gate connecting portion 160 and a lead-out connecting portion 170. The insulating substrate 110 includes a main plane 111. The gate line 120, the source line 130, the lead-out line 140 and the conductive portion 150 are laminated on the main plane 111.

The gate line 120 extends in a lateral direction on the main plane 111. In this embodiment, the lateral direction is exemplified as a first direction.

Different from the gate line 120, the source line 130 and the lead-out line 140 extend in a vertical direction on the main plane 111. In this embodiment, the vertical direction is exemplified as a second direction.

The gate line 120, the source line 130 and the lead-out line 140 are laminated between a layer of the conductive portion 150 and the insulating substrate 110. The conductive portion 150 formed of a conductive member covers at least a part of the gate line 120 and at least part of the lead-out line 140. In this embodiment, the conductive portion 150 is exemplified as a first conductive portion.

Similar to the conductive portion 150, the gate connecting portion 160 is formed of a conductive member. The gate connecting portion 160 connects the conductive portion 150 to the gate line 120. Thus, the gate line 120 electrically connects to the conductive portion 150.

Similar to the conductive portion 150, the lead-out connecting portion 170 is formed of a conductive member. The lead-out connecting portion 170 connects the conductive portion 150 to the lead-out line 140. Thus, the lead-out line 140 electrically connects to the conductive portion 150.

Because both the gate connecting portion 160 and the lead-out connecting portion 170 extend from the conductive portion 150, they can be formed at a same step. A forming process of the gate connecting portion 160 and the lead-out connecting portion 170 are described in following embodiments.

Source signals are input to the source line 130 as image signals. Gate signals are input to the lead-out line 140 as scanning signals. Subsequently gate signals are input to the conductive portion 150 through the lead-out connecting portion 170. Subsequently gate signals are transmitted from the conductive portion 150 to the gate line 120 through the gate connecting portion 160. As a result, the display device 100 can display images on the display area in accordance with image signals.

[Second Embodiment]

The lead-out line extends in the same direction as the source line. If the source line overlaps with the lead-out line, the lead-out connecting portion is likely to interfere with the source line structurally. In the second embodiment, techniques of preventing interference between the source line and the lead-out connecting portion are described.

FIG. 2 is a schematic perspective view of a display device 100A in this embodiment. With reference to FIG. 2, the display device 100A is described. The common numeral between the first embodiment and the second embodiment is labeled on an element which has the same or like functions as that in the first embodiment. Thus the description in the first embodiment refers to the same element.

Similar to the first embodiment, the display device 100A also includes the insulating substrate 110 and the gate line 120 and the conductive portion 150 and the gate connecting portion 160. The display device 100A includes a source line 130A, a lead-out line 140A and a lead-out connecting portion 170A.

Similar to the first embodiment, the gate line 120, the source line 130A, the lead-out line 140A and the conductive portion 150 are laminated on the main plane 111. The lead-out line 140A includes a transmission line 141 which transmits gate signals in the vertical direction and a protruding part 142 protruding laterally from the transmission line 141. Because the transmission line 141 extends in the vertical direction between the source line 130A and the main plane 111, source line 130A overlaps at least part of the transmission line 141. Because the protruding part 142 protrudes from the transmission line 141 laterally, the protruding part 142 does not overlap with the source line 130A. In this embodiment, the transmission line 141 is exemplified as a line part. The protruding part 142 is exemplified as a protruding portion.

Similar to the first embodiment, the lead-out connecting portion 170A is formed of a conductive member. The lead-out connecting portion 170A electrically connects the protruding part 142 to the conductive portion 150. Thus, gate signals are transmitted from the lead-out line 140A to the gate line 120 properly via the lead-out connecting portion 170A and the conductive portion 150.

[Third Embodiment]

Because the gate line, the lead-out line, the source line and the conductive portion are used for transmission of image signals, they are insulated from each other. In this embodiment, an insulating structure is described.

Figure 3B:
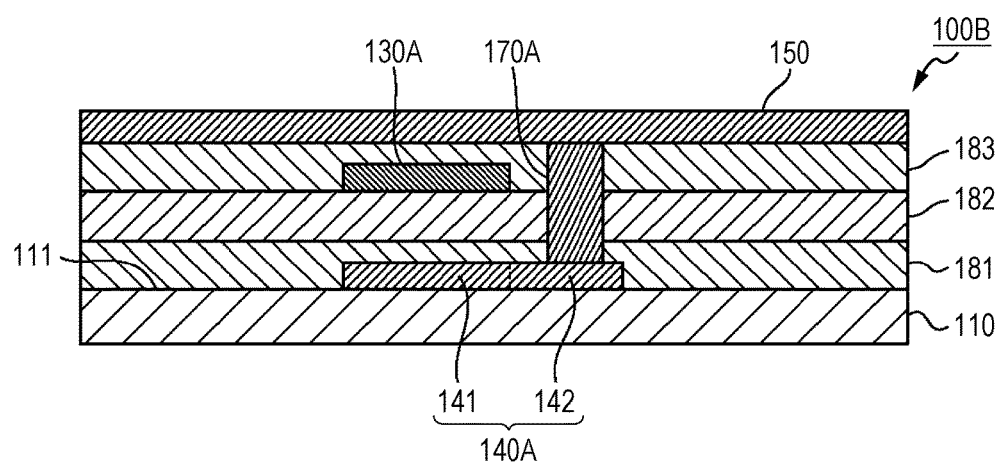

FIG. 3 A is a schematic cross-sectional view of a display device 100B along the gate line 120 in this embodiment. FIG. 3B is a schematic cross-sectional view of the lead-out connecting portion 170A in the display device 100B. With reference to FIG. 3A, and FIG. 3B, the display device 100B is described. The common numeral between the second embodiment and the third embodiment is labeled on an element which has the same or like functions as that in the second embodiment. Thus the description in the second embodiment refers to the same element.

Similar to the second embodiment, the display device 100B includes the insulating substrate 110, the gate line 120, the source line 130A, the lead-out line 140A, the conductive portion 150, the gate connecting portion 160 and the lead-out connecting portion 170A. The display device 100B further includes a first insulating layer 181, a second insulating layer 182 and a third insulating layer 183. The first insulating layer 181 is laminated on the main plane 111 in the insulating substrate 110. The second insulating layer 182 is laminated on the first insulating layer 181. The third insulating layer 183 is laminated on the second insulating layer 182. Because the lead-out line 140A is formed between the main plane 111 and the first insulating layer 181, the first insulating layer 181 insulates electrically the lead-out lines 140A from the gate lines 120. Because the gate line 120 is formed between the first insulating layer 181 and the second insulating layer 182, the second insulating layer 182 insulates electrically the gate lines 120 from the source line 130A. Because the source line 130A is formed between the second insulating layer 182 and the third insulating layer 183, the third insulating layer 183 insulates electrically the source line 130A from the conductive portion 150. Because the conductive portion 150 is formed on the third insulating layer 183, the third insulating layer 183 insulates electrically the source line 130A from the conductive portion 150. In this embodiment, because the first insulating layer 181 and the second insulating layer 182 are laminated between the lead-out line 140A and the source line 130A, a low capacity between the lead-out line 140A and the source line 130A can be formed.

[Fourth Embodiment]

A laminated position of the gate line and lead-out line may differ from the laminated positions described in the third embodiment. In the fourth embodiment, another insulation structure is described.

Figure 4A:
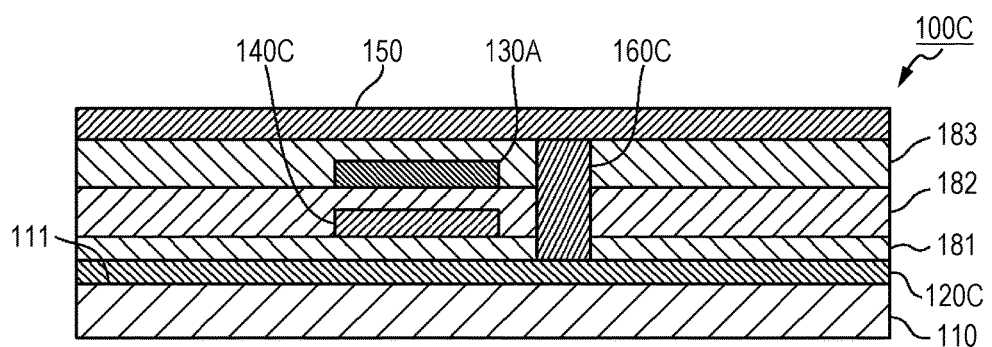
FIG. 4 A is a schematic cross-sectional view of a display device in a fourth embodiment.
Figure 4B:
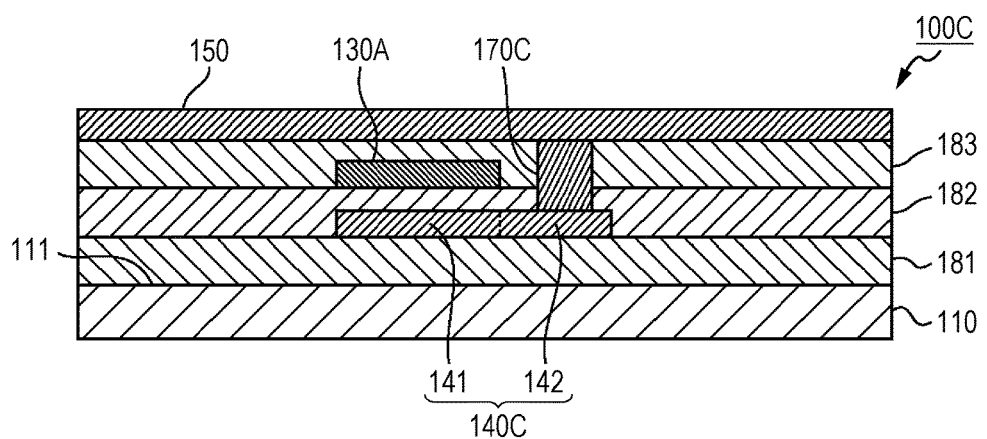

FIG. 4 A is a schematic cross-sectional view along a gate line 120C of a display device 100C in the fourth. FIG. 4 B is a schematic cross-sectional view of a lead-out connecting portion 170C of the display device 100C. With reference to FIG. 4A and FIG. 4B, the display device 100C is described. The common numeral between the third embodiment and the fourth embodiment is labeled on an element which has the same or like functions as that in the third embodiment. Thus the description in the third embodiment refers to the same element.

Similar to the third embodiment, the display device 100C includes the insulating substrate 110, source lines 130A, conductive portions 150, the first insulating layer 181, the second insulating layer 182 and the third insulating layer 183. The display device 100C further includes a gate line 120C, a lead-out line 140C, a gate connecting portion 160C and a lead-out connecting portion 170C.

Similar to the third embodiment, the gate line 120C is formed between the main plane 111 and the first insulating layer 181. The Lead-out line 140C is formed between the first insulating layer 181 and the second insulating layer 182. The gate connecting portion 160C electrically connects between the gate line 120C and the conductive portion 150. Because the gate line 120C is longer than the source line 130A in an oblong display, a capacity formed between the gate lines 120C and the common electrodes may cause problems. In the fourth embodiment, because the first insulating layer 181 and the second insulating layer 182 are laminated between the gate line 120C and the common electrode, a lower capacity can be formed.

Similar to the third embodiment, a lead-out line 140C includes the transmission line 141 and the protruding part 142. The lead-out connecting portion 170C electrically connects between the protruding part 142 and the conductive portion 150.

[Fifth Embodiment]

According to the display device in the third embodiment, the conductive portion connects between the lead-out line and the gate line by a small number of manufacturing steps. In the fifth embodiment, a formation process of an electrical connection structure around a conductive portion is described.

Figure 5A:
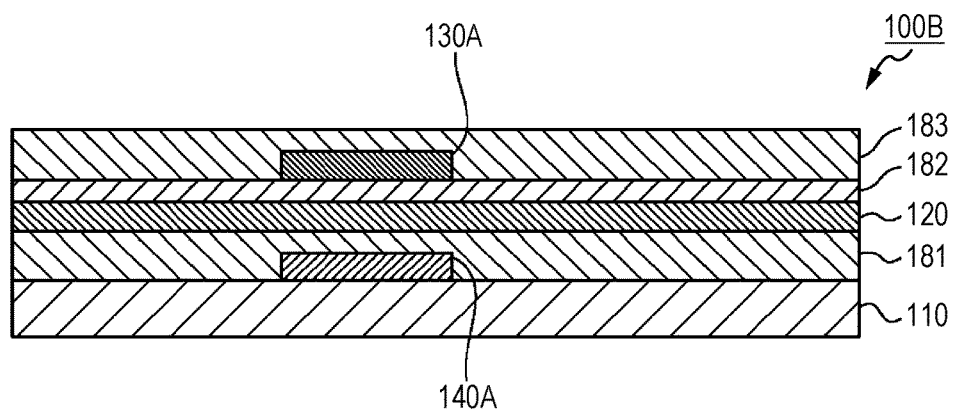
FIG. 5 A is a schematic cross-sectional view of the display device in FIG. 3 A (fifth embodiment).
Figure 5B:
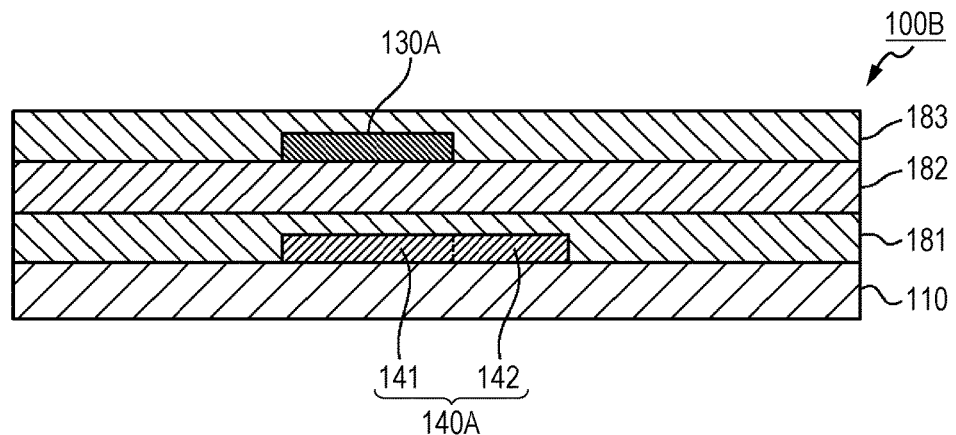

FIG. 5A is a schematic cross-sectional view of the display device 100B. FIG. 5B is another schematic cross-sectional view of the display device 100B. With reference to FIG. 5A and FIG. 5B, a manufacturing process of the display device 100B is described. The common numeral between the third embodiment and the fifth embodiment is labeled on an element which has the same or like functions as that in the third embodiment. Thus the description in the third embodiment refers to the same element.

As described in the third embodiment, the lead-out line 140A is formed between the insulating substrate 110 and the first insulating layer 181. The gate line 120 is formed between the first insulating layer 181 and the second insulating layer 182. The source line 130A is formed between the second insulating layer 182 and the third insulating layer 183.

Figure 6A:
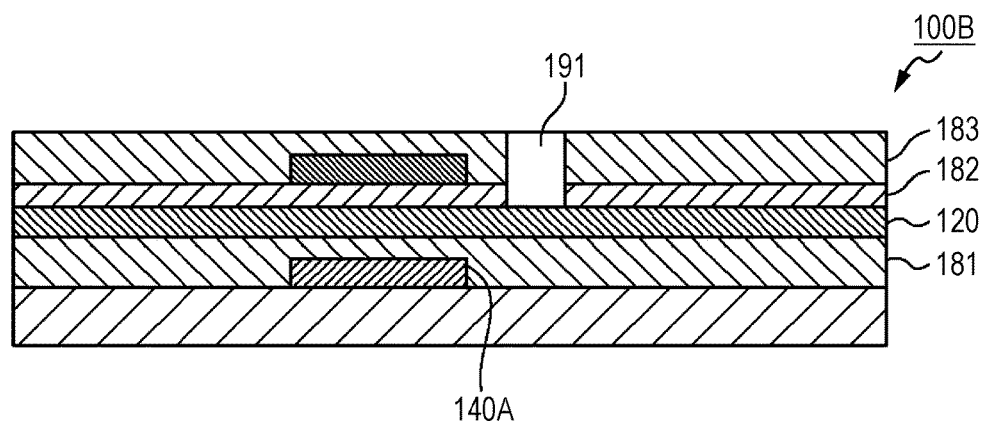
FIG. 6 A is a schematic cross-sectional view of the display device in FIG. 3 A (fifth embodiment).
Figure 6B:
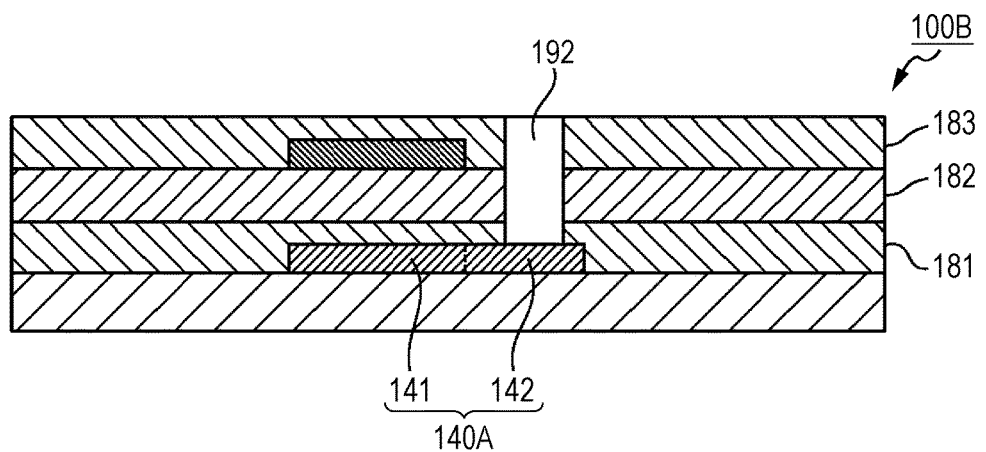

FIG. 6A is a schematic cross section of the display device 100B. FIG. 6B is schematic other cross sections of the display device 100B. In reference with FIG. 6A and FIG. 6B, a manufacturing process of display device 100B is described.

As shown in FIG. 6A, after a formation of the third insulating layer 183, a through-hole 191 is formed on the gate line 120. The through-hole 191 runs through the second insulating layer 182 and the third insulating layer 183 towards the gate line 120. As a result, a part of the gate line 120 is exposed.

As shown in FIG. 6B, after a formation of the third insulating layer 183, a through-hole 192 is formed on the protruding part 142. The through-hole 192 runs through the first insulating layer 181 to third insulating layer 183 towards the protruding part 142. As a result, at least a part of the protruding part 142 is exposed.

The through-holes 191, 192 can be formed in one step as shown in FIG. 6A and FIG. 6B. In this embodiment, the through-hole 191 is exemplified as a first through-hole. The through-hole 192 is exemplified as a second through-hole. The processes shown in FIG. 6A and FIG. 6B are exemplified as a through-hole step.

Figure 7A:
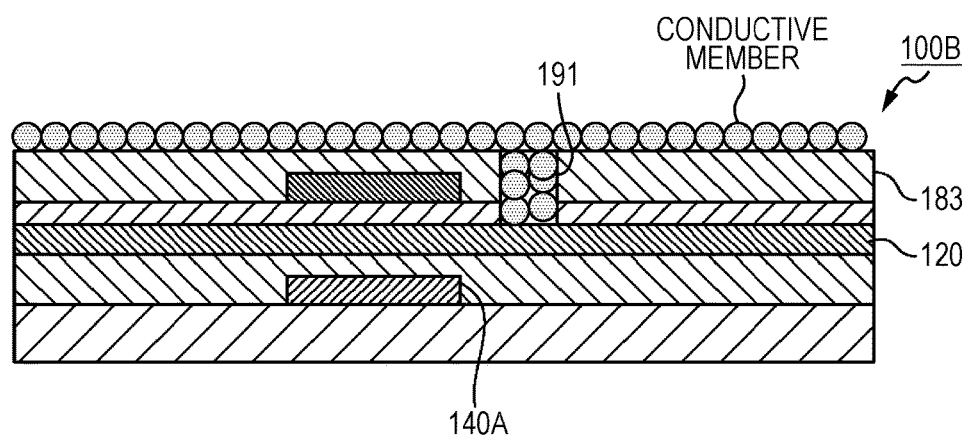
FIG. 7 A is a schematic cross-sectional view of the display device in FIG. 3 A (fifth embodiment).
Figure 7B:
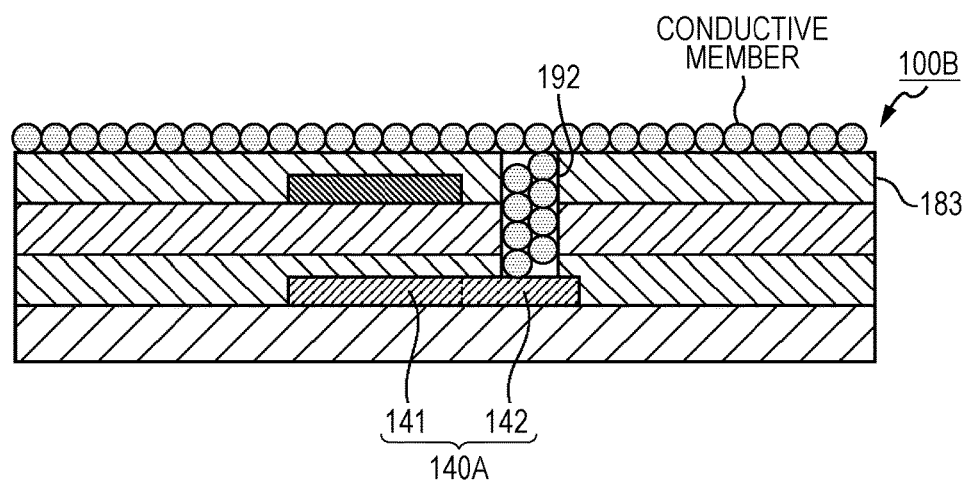

FIG. 7A is a schematic cross-sectional view of the display device 100B. FIG. 7B is schematic another cross sectional view of display device 100B. With reference to FIG. 3A, FIG. 3B, FIG. 7A and FIG. 7B, a manufacturing process of the display device 100B is described.

After a formation of through-holes 191,192, a conductive member is deposited on the third insulating layer 183 shown in FIG. 7A and FIG. 7B. Because the through-hole 191 runs through from the third insulating layer 183 to the gate line 120, the conductive member flows into the through-hole 191. Because the through-hole 192 runs through from the third insulating layer 183 to the protruding part 142, the conductive member flows into the through-hole 192.

The conductive member deposited on a surface of the third insulating layer 183 becomes a conductive portion 150. The conductive member which flows into the through-hole 191 becomes the gate connecting portion 160. The conductive member which gets into the through-hole 192 becomes the lead-out connecting portion 170A.

The conductive portion 150 is laminated on the third insulating layer 183 by a process shown in FIG. 7A and FIG. 7B. Because the conductive member is supplied to the through-holes 191, 192 at the same time, an electrical connection by the conductive portion 150 is formed between the gate line 120 and the lead-out line 140. In this embodiment, the process shown in FIG. 7A and FIG. 7B is exemplified as a connecting step.

[Sixth Embodiment]

In the display device of the fourth embodiment, the conductive portion connects between the lead-out line and the gate line by a small number of manufacturing steps. In the sixth embodiment, a formation process of an electrical connection structure around a conductive portion is described.

Figure 8A:
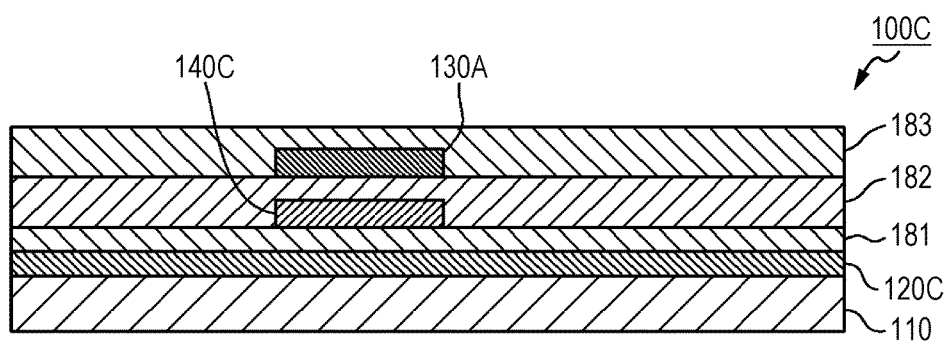
FIG. 8 A is a schematic cross-sectional view of the display device in FIG. 4 A (sixth embodiment).
Figure 8B:
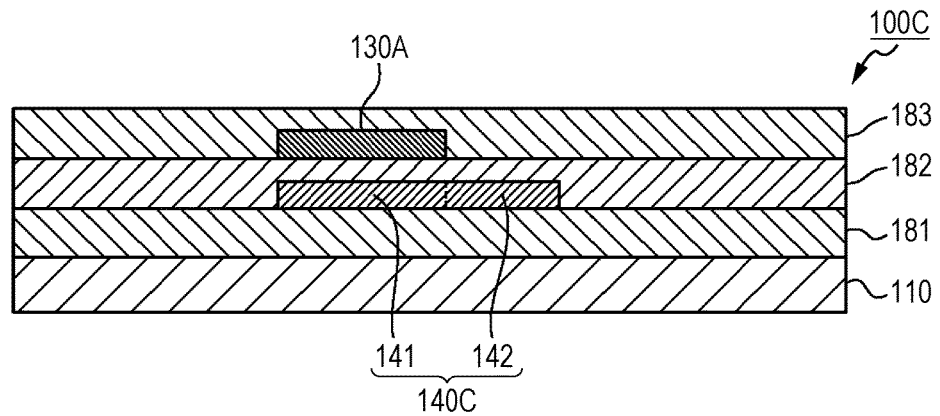

FIG. 8A is a schematic cross-sectional view of the display device 100C. FIG. 8B is another schematic cross-sectional view of the display device 100C. With reference to FIG. 8A and FIG. 8B, a manufacturing process of the display device 100C is described. The common numeral between the fourth embodiment and the sixth embodiment is labeled on an element which has the same or like functions as that in the fourth embodiment. Thus the description in the fourth embodiment refers to the same element.

The lead-out line 140C is formed between the first insulating layer 181 and the second insulating layer 182 as described with the fourth embodiment. A gate line 120C is formed between the insulating substrate 110 and the first insulating layer 181. The source line 130A is formed between the second insulating layer 182 and the third insulating layer 183.

Figure 9A:
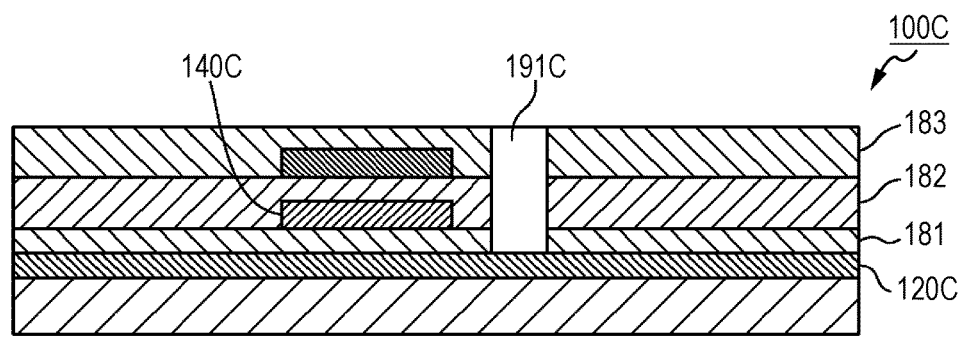
FIG. 9 A is a schematic cross-sectional view of the display device in FIG. 4 A (sixth embodiment).
Figure 9B:
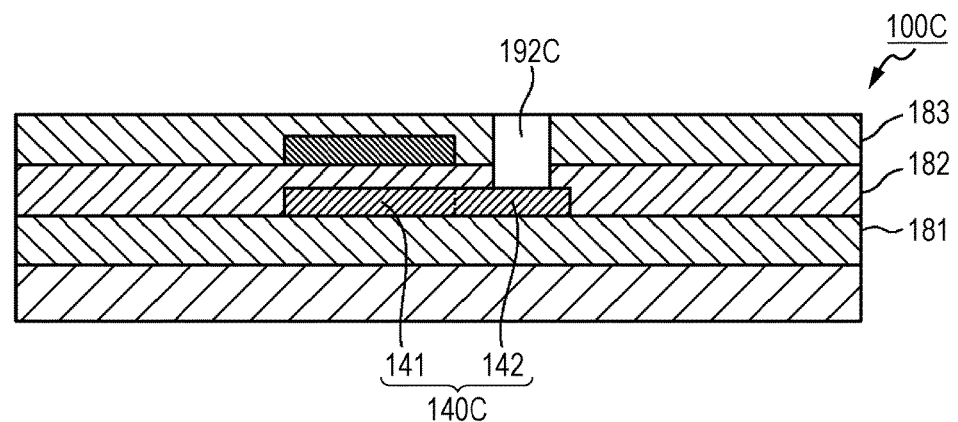

FIG. 9A is a schematic cross-sectional view of the display device 100C. FIG. 9B is another schematic cross-sectional view of the display device 100C. With reference to FIG. 9A and FIG. 9B, a manufacturing process of the display device 100C is described.

As shown in FIG. 9A, after a formation of the third insulating layer 183, a through-hole 191C is formed on the gate line 120C. The through-hole 191C runs through the first insulating layer 181 to the third insulating layer 183. The gate line 120C is exposed in the through-hole 191C.

As shown in FIG. 9B, after a formation of the third insulating layer 183, a through-hole 192C is formed on the protruding part 142. The through-hole 192C runs through the second insulating layer 182 and the third insulating layer 183. The protruding part 142 is exposed in the through-hole 191C.

Figure 10A:
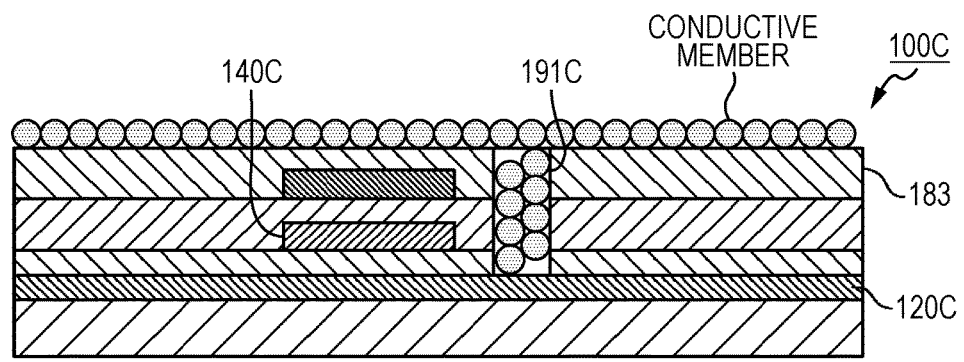
FIG. 10A is a schematic cross-sectional view of the display device in FIG. 4 A (sixth embodiment).
Figure 10B:
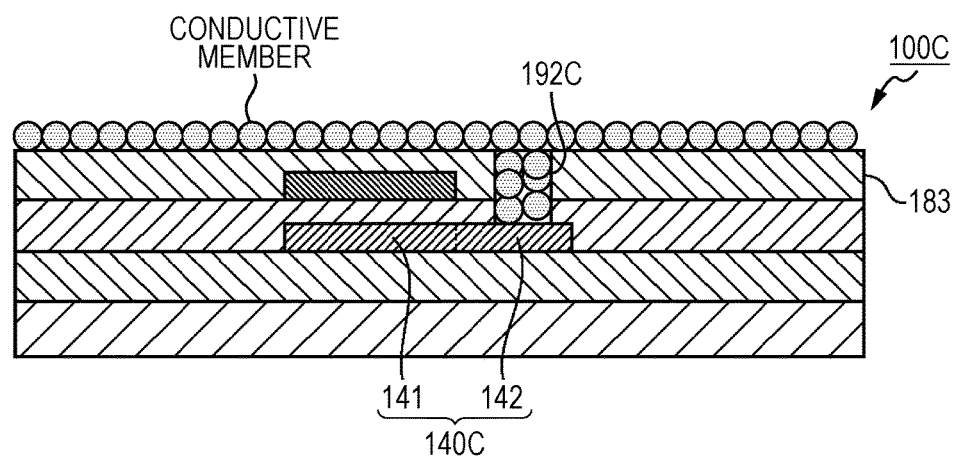
FIG. 10 B is a schematic cross-sectional view of the display device in FIG. 4 B (sixth embodiment).

FIG. 10A is a schematic cross-sectional view of the display device 100C. FIG. 10B is another schematic cross-sectional view of the display device 100C. With reference to FIG. 4A, FIG. 4B, FIG. 10P, and FIG. 10B, a manufacturing process of the display device 100C is described.

As shown in FIG. 10A and FIG. 10B, after a formation of through-holes 191C, 192C, a conductive member is deposited on the third insulating layer 183. Because the through-hole 191C runs through from the third insulating layer 183 to the gate line 120C, the conductive member flows into the through-hole 191C. Because the through-hole 192C runs through from the third insulating layer 183 to the protruding part 142, the conductive member flows into the through-hole 192C.

The conductive member deposited on the surface of the third insulating layer 183 becomes the conductive portion 150. The conductive member 150 which flows into the through-hole 191C becomes the gate connecting portion 160C. The conductive member which flows into the through-hole 192C becomes the lead-out connecting portion 170C.

[Seventh Embodiment]

Source signals are input to pixel electrodes. Thus the pixel electrode is formed of a conductive member. As mentioned above, because the conductive portion is made of conductive member, the conductive portion may be formed in a pixel electrodes layer (in the same layer as the pixel electrode). In the seventh embodiment, a conductive portion formed in the pixel electrode layer is described.

Figure 11:
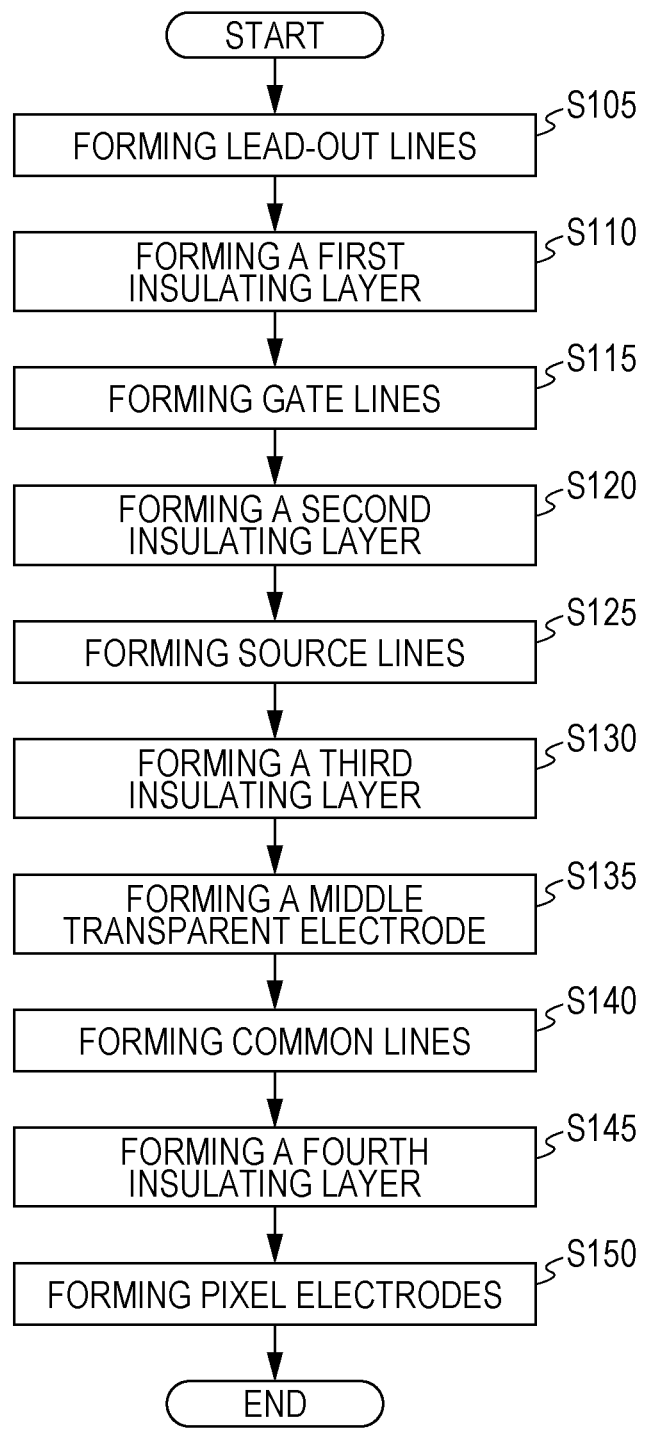
FIG. 11 is a flow chart showing an exemplary laminating process to manufacture a display device (seventh embodiment).

FIG. 11 is a flow chart showing an exemplary laminating process to manufacture a display device. With reference to FIG. 11, a laminating process is described.

(Step S105)

In a step S105, an insulating substrate is prepared. Subsequently lead-out lines are formed on the insulating substrate. Subsequently a step S110 is carried out.

(Step S110)

In the step S110, a first insulating layer is laminated. The first insulating layer covers the insulating substrate and the lead-out lines. Subsequently a step S115 is carried out.

(Step S115)

In the step S115, the gate lines are formed on the first insulating layer. The first insulating layer insulates the gate lines from the lead-out lines properly. Subsequently a step S120 is carried out.

(Step S120)

In the step S120, a second insulating layer is laminated. The second insulating layer covers the first insulating layer and the gate lines. After the formation of the second insulating layer, a step S125 is carried out.

(Step S125)

In the step S125, the source lines are formed on the second insulating layer along the lead-out lines. As a result, the second insulating layer is formed between the source lines and the lead-out lines. The second insulating layer insulates the source lines from the lead-out lines properly. Because the source lines extend in a substantial right angle to the gate lines, rectangular regions are defined on the second insulating layer by the source lines and the gate lines. In the following explanation, a region of the substantial rectangle shape sectioned by the source lines and the gate lines is named "a pixel region". After the formation of the second insulating layer, a step S130 is carried out.

(Step S130)

In the step S130, a third insulating layer is further laminated. Subsequently a step S135 is carried out. In this embodiment, the step S130 is exemplified as an insulating step for forming an insulating layer between the common electrode layer and a source line.

(Step S135)

In the step S135, the middle transparent electrode is formed. The middle transparent electrode is formed on the third insulating layer to cover a pixel region. After the formation of the middle transparent electrode, a step S140 is carried out.

(Step S140)

In the step S140, common lines are formed along the source lines. The common lines connect to the middle transparent electrode. After the formation of the common lines, step S145 is carried out.

(Step S145)

In the step S145, a fourth insulating layer is formed. The fourth insulating layer covers the middle transparent electrode and the common lines. Subsequently through-holes are formed towards the lead-out lines and the gate lines. The formation of the through-holes may be carried out by the known photoresist technology. After the formation of the through-holes, a step S150 is carried out. In this embodiment, the step S145 is exemplified as a step to laminate an insulating layer on a common electrode layer (on the same layer as the common electrode)

(Step S150)

In the step S150, a pixel electrode layer including the pixel electrodes is formed. As a result, the middle transparent electrode is positioned opposing the pixel electrodes. The brightness of the pixel region is determined in accordance with a difference in an electric potential between the pixel electrode and the middle transparent electrode.

In this embodiment, the step S110, the step S120, the step S130 and the step S145 are exemplified as an insulating step for forming insulating layers.

Figure 12:
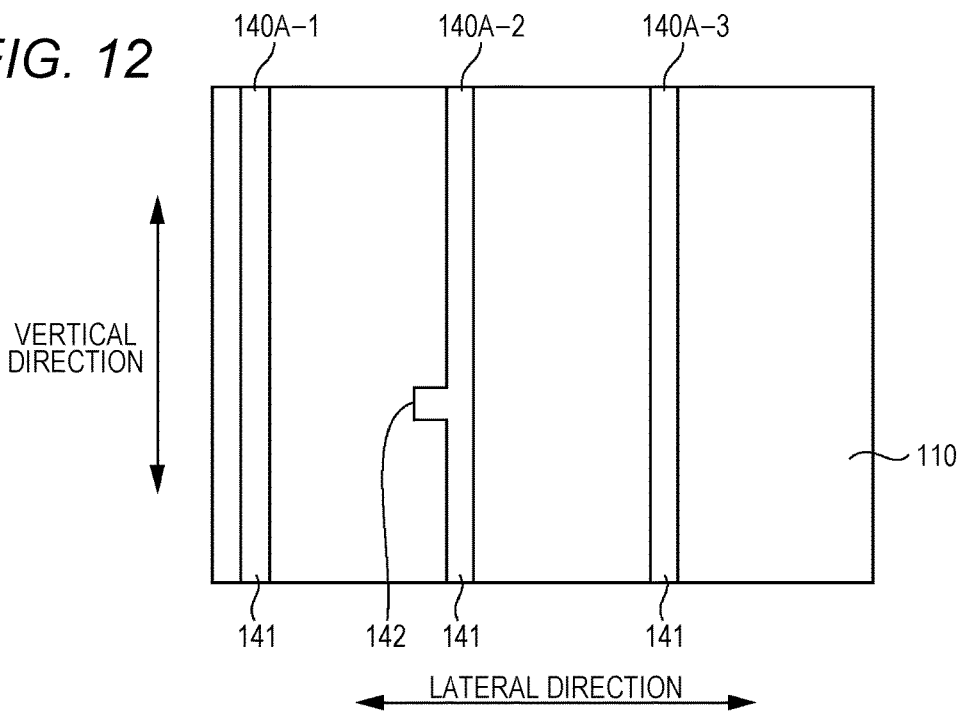
FIG. 12 is a schematic view of a forming process of lead-out lines in the laminating process shown in FIG. 11.

FIG. 12 is a schematic view of a forming process of the lead-out lines in the laminating process (Step S105). With reference to FIG. 11 and FIG. 12, the forming process of the lead-out lines is described. The common numeral between the third or fifth embodiment and the seventh embodiment is labeled on an element which has the same or like functions as that in the third or fifth embodiment. Thus the description in the third or fifth embodiment refers to the same element.

An insulating substrate 110 is prepared. The lead-out lines 140A-1, 140A-2, 140A-3 are formed extending in the vertical direction on the insulating substrate 110. The lead-out lines 140A-1, 140A-2, 140A-3 correspond to the lead-out lines 140A described in the third embodiment. FIG. 12 shows transmission lines 141 of the lead-out lines 140A-1, 140A-2, 140A-3. FIG. 12 further shows a protruding part 142 of the lead-out line 140A-2.

Figure 13:
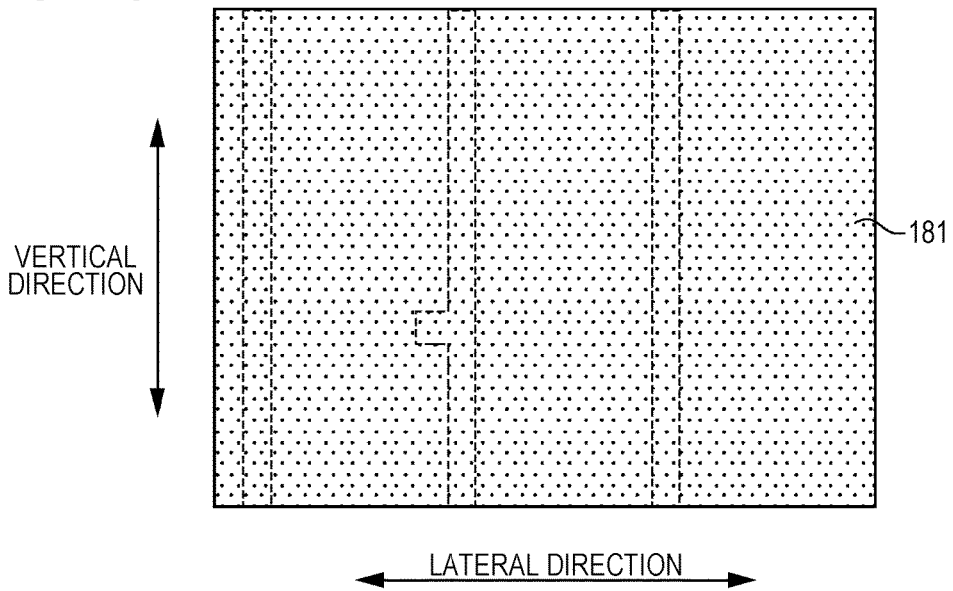
FIG. 13 is a schematic view of a forming process of a first insulating layer in the laminating process shown in FIG. 11.

FIG. 13 is a schematic view of a forming process of a first insulating layer (Step S110). With reference to FIG. 11 to FIG. 13, a forming process of a first insulating layer is described.

The first insulating layer 181 is formed to cover a whole surface of the insulating substrate 110.

Figure 14:
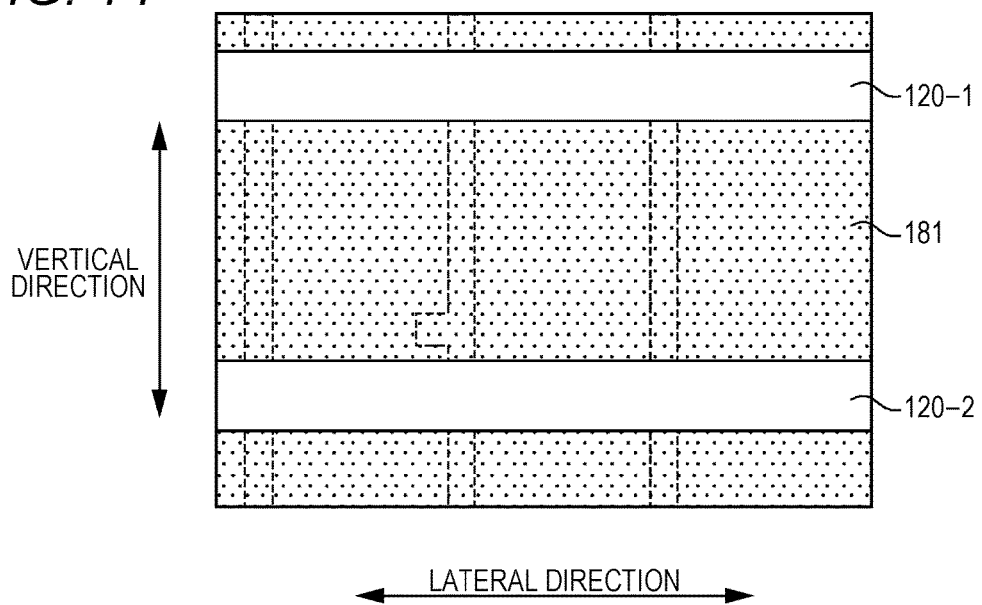
FIG. 14 is a schematic view of a forming process of gate lines in the laminating process shown in FIG. 11.

FIG. 14 is a schematic view of a forming process of the gate lines (Step S115). With reference to FIG. 11, FIG. 13 and FIG. 14, a forming process of the gate lines is described.

The gate lines 120-1, 120-2 are formed extending in the lateral direction on the first insulating layer 181. The gate lines 120-1, 120-2 corresponds to gate lines 120 described in the third embodiment.

Figure 15:
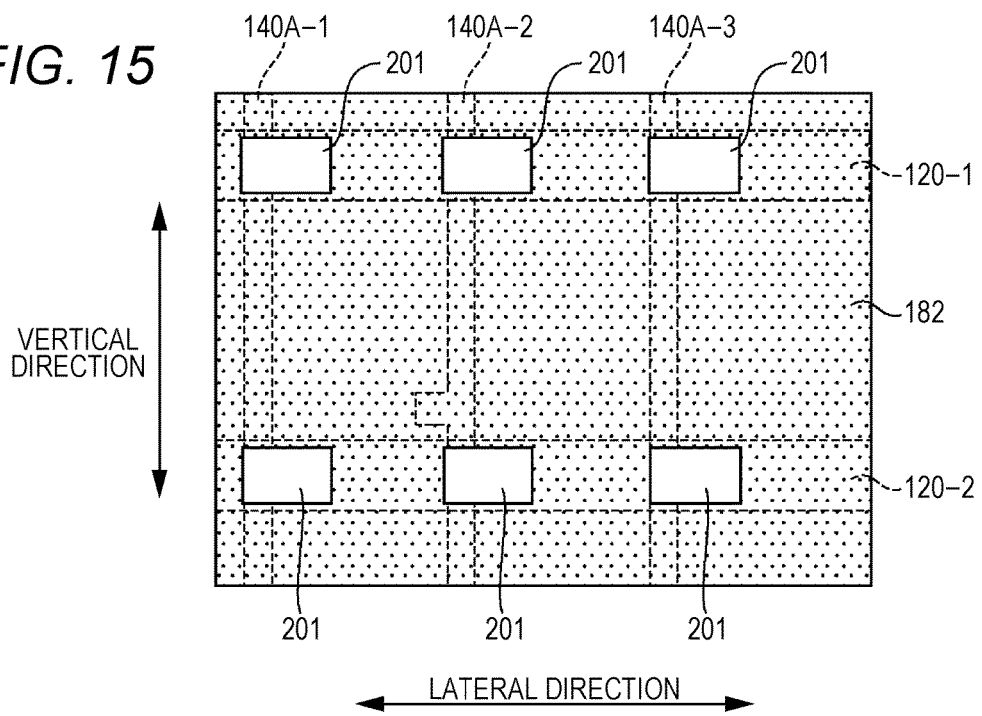
FIG. 15 is a schematic view of a forming process of a second insulating layer in the laminating process shown in FIG. 11.

FIG. 15 is a schematic view of a forming process of a second insulating layer (Step S120). With reference to FIG. 11, FIG. 14 and FIG. 15, a forming process of the second insulating layer is described.

Amorphous silicon 201 are formed in regions corresponding to overlapping positions by the lead-out lines 140A-1, 140A-2, 140A-3 and the gate lines 120-1, 120-2.

Figure 16:
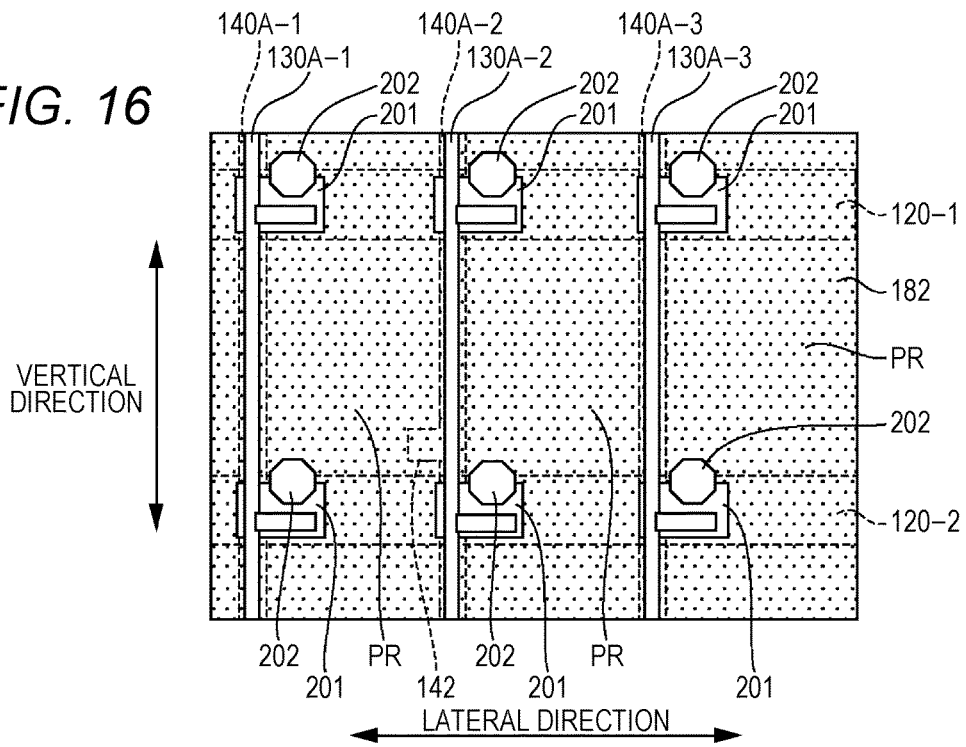
FIG. 16 is a schematic view of a forming process of source lines in the laminating process shown in FIG. 11.

FIG. 16 is a schematic view of a forming process of the source lines (Step S125). With reference to FIG. 11, FIG. 15 and FIG. 16, the forming process of the source lines is described.

The source lines 130A-1, 130A-2, 130A-3 are formed extending in a vertical direction on the second insulating layer 182 and the amorphous silicon 201. The source line 130A-1 is laminated on the lead-out line 140A-1 through the second insulating layer 182 and the amorphous silicon 201. The source line 130A-2 is laminated on the lead-out line 140A-2 through the second insulating layer 182 and the amorphous silicon 201. The source line 130A-3 is laminated on the lead-out line 140A-3 through the second insulating layer 182 and the amorphous silicon 201. As a result, an area on the second insulating layer 182 are sectioned by the source lines 130A-1, 130A-2, 130A-3 and the gate lines 120-1, 120-2 to the pixel regions PR. The source lines 130A-1, 130A-2, 130A-3 each corresponds to the source line 130A described in the third embodiment.

Transistors 202 are formed on the amorphous silicon 201. The transistors 202 are connected to the gate lines 120-1, 120-2 through the amorphous silicon 201. In addition, the transistors 202 connect to the source lines 130A-1, 130A-2 and 130A-3. The transistors 202 allow source signals output from the source lines 130A-1, 130A-2 and 130A-3 to be written to pixel regions in accordance with gate signals which are transmitted from the lead-out lines 140A-1 and 140A-2 to the gate line 120-1 and 120-2.

Figure 17:
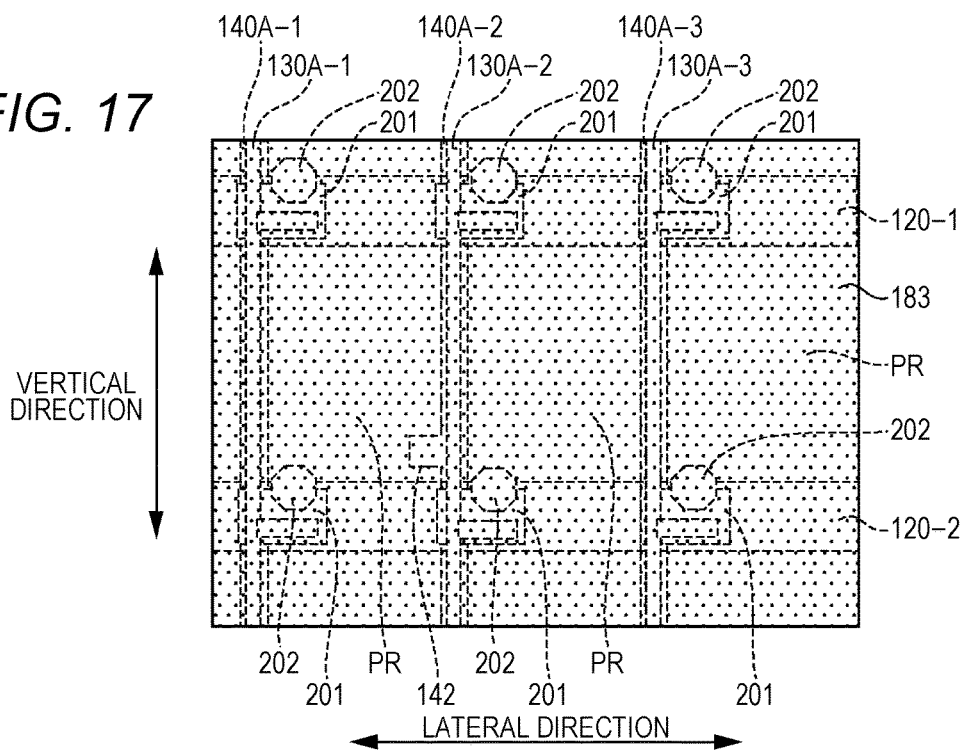
FIG. 17 is a schematic view of a forming process of a third insulating layer in the laminating process in FIG. 11.

FIG. 17 is a schematic view of a forming process of the third insulating layer (Step S125). With reference to FIG. 11, FIG. 16 and FIG. 17, the forming process of the third insulating layer is described.

The third insulating layer 183 covers a whole amorphous silicon 201, the transistors 202 and the source lines 130A-1, 130A-2 and 130A-3.

Figure 18:
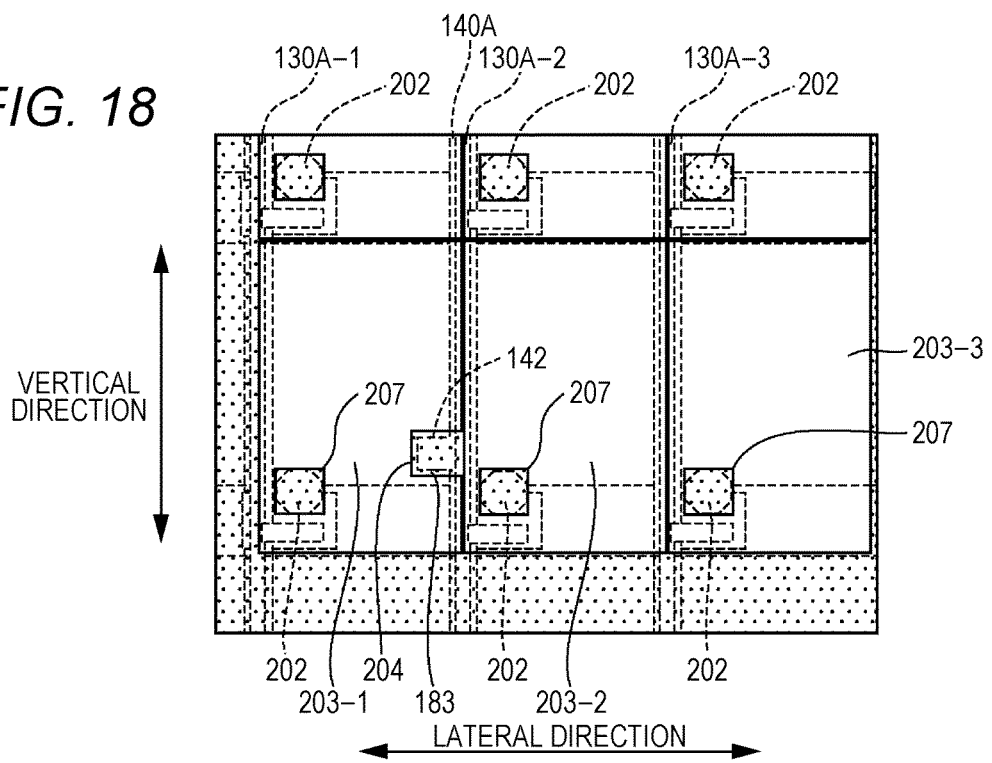
FIG. 18 is a schematic view of a forming process of a middle transparent substrate in the laminating process shown in FIG. 11.

FIG. 18 is a schematic view of a forming process of the middle transparent substrate (Step S135). With reference to FIG. 11, FIG. 17 and FIG. 18, the forming process of the middle transparent electrode is described.

In the step S135, the middle transparent electrodes 203-1, 203-2 and 203-3 are formed to cover the pixel regions PR on third insulating layer 183. The middle transparent electrode 203-1 covers a pixel region PR between the source line 130A-1 and the source line 130A-2. The middle transparent electrode 203-2 covers a pixel region PR between the source lines 130A-2 and 130A-3. The source line 130A-3 is located in a boarder of the two middle transparent electrodes 203-2 and 203-3. Each opening 207 in the middle transparent electrode 203-1, 203-2 and 203-3 is formed on each transistor 202.

A cutout portion 204 is formed in a position of the middle transparent electrode 203-1 corresponding to the protruding part 142 of the lead-out line 140A-2. Thus the third insulating layer 183 is exposed in the cutout portion 204.

Figure 19:
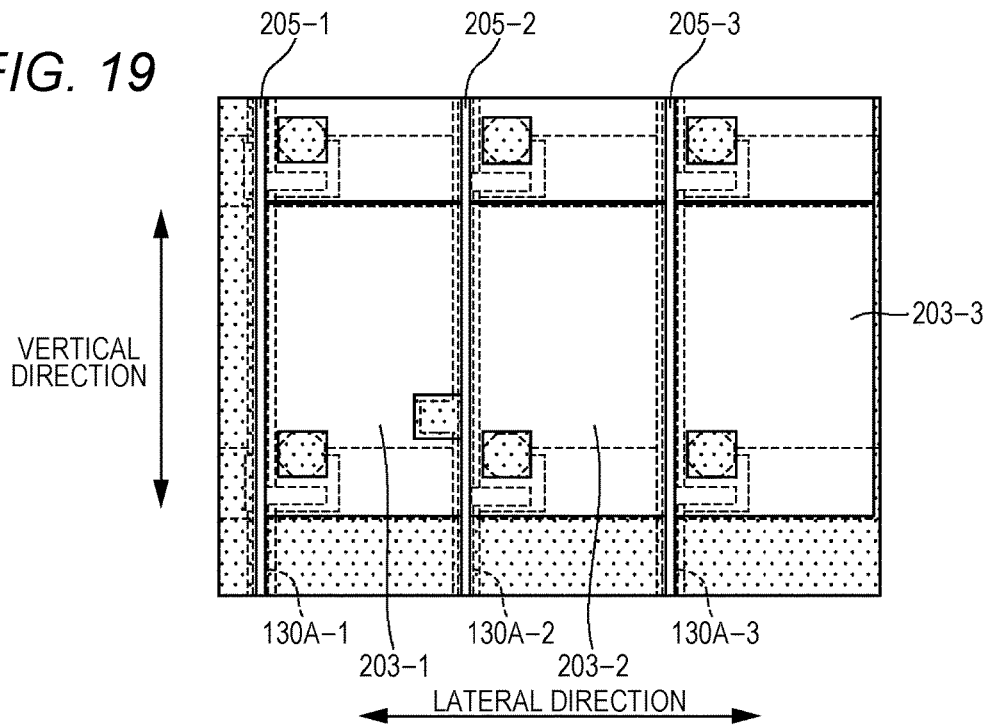
FIG. 19 is a schematic view of a forming process of common lines in the laminating process shown in FIG. 11.

FIG. 19 is a schematic view of a forming process of the common lines (Step S140). With reference to FIG. 11, FIG. 18 and FIG. 19, the forming process of the common lines is described.

In the step S140, a common line 205-1 is formed along the source line 130A-1. A common line 205-2 is formed along the source line 130A-2. A common line 205-3 is formed along the source line 130A-3. The common lines 205-1, 205-2 and 205-3 are used to keep an electric potential of the middle transparent electrodes 203-1, 203-2 and 203-3 substantial uniform.

FIG. 20 is a schematic view of a forming process of the fourth insulating layer (Step S145). With reference to FIG. 3A, FIG. 6A, FIG. 6B FIG. 11, FIG. 19 and FIG. 20, the forming process of the fourth insulating layer is described.

The fourth insulating layer 184 is formed to cover the common lines 205-1 to 205-3, the middle transparent electrodes 203-1 to 203-3 and the third insulating layer 183.

A through-hole 191D described with reference to FIG. 3 is formed in the fourth insulating layer 184. As a result, parts of the gate line 120-2 are exposed. The through-hole 191D corresponds to the through-hole 191 described with reference to FIG. 6A.

A through-hole 192D described with reference to FIG. 3 is formed in the fourth insulating layer 184. As a result, parts of the protruding part 142 are exposed. The through-hole 192D corresponds to the through-hole 192 described with reference to FIG. 6B.

The through-hole 193 corresponding to the transistor 202 is formed in the fourth insulating layer 184. The transistors 202 are exposed in the through-holes 193.

FIG. 21 is a schematic view of a forming process of the pixel electrode layer (Step S150). With reference to FIG. 3A, FIG. 7A, FIG. 7B, FIG. 11, FIG. 20 and FIG. 21, the forming process of the pixel electrodes is described.

In the step S150, pixel electrodes 206-1, 206-2 and 206-3 and a connection layer 150D are formed. The pixel electrode 206-1 is formed through the fourth insulating layer 184 to face the middle transparent electrode 203-1. The pixel electrode 206-2 is formed to face the middle transparent electrode 203-2 with the fourth insulating layer 184 interposed between. The pixel electrode 206-3 is formed to face the middle transparent electrode 203-3 with the fourth insulating layer 184 interposed between. The pixel electrodes 206-1, 206-2 and 206-3 electrically connect to the transistors 202 via the through-holes 193. The transistors 202 allow source signals to be written to the pixel electrodes 206-1, 206-2 and 206-3 in accordance with gate signals.

The connection layer 150D may be formed of the same conductive member as the pixel electrodes 206-1, 206-2 and 206-3. The connection layer 150D is formed to cover the through-holes 191D and 192D. As a result, according to principles described with reference to FIG. 7A and FIG. 7B, the lead-out line 140A-2 electrically connects to the gate line 120-2. The connection layer 150D corresponds to the conductive portion 150 described in the third embodiment. In this embodiment, the step S150 is exemplified as a step of laminating a first conductive portion.

The laminating process described with reference to FIG. 11 is exemplary. Depending on a kind and a design of a display device, another laminating technology may be used.

Figure 22A:
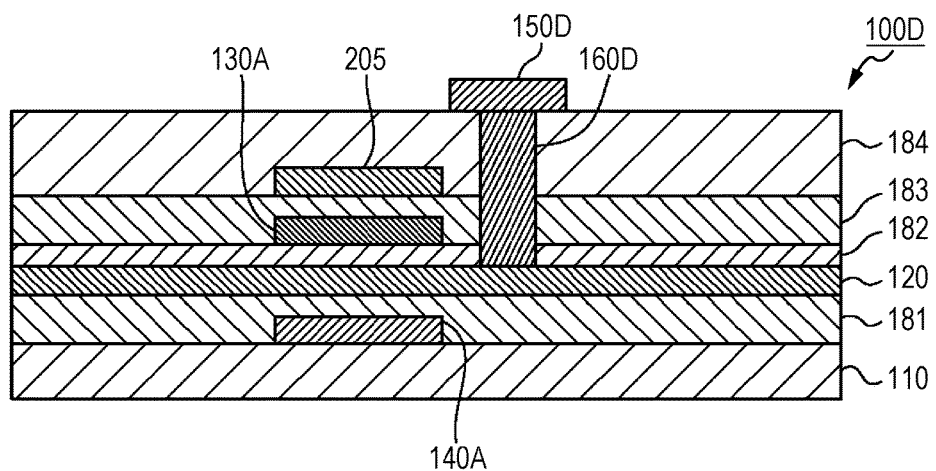
FIG. 22 A is a schematic cross-sectional view of a display device manufactured according to the flow chart in FIG. 11.
Figure 22B:
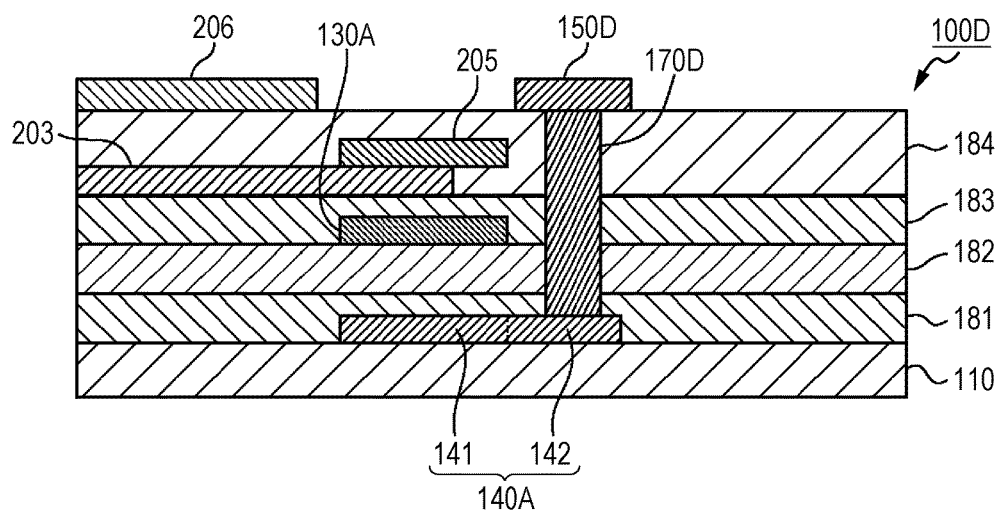

FIG. 22 A and FIG. 22 B are schematic cross-sectional views of a display device 100D manufactured according to the flow chart described with reference to FIG. 11. With reference to FIG. 11, FIG. 20, FIG. 22A and FIG. 22B, the display device 100D is described.

The display device 100D includes the insulating substrate 110, the gate lines 120, the source lines 130A, the lead-out lines 140A, the first insulating layer 181, the second insulating layer 182, the third insulating layer 183, the fourth insulating layer 184, the middle transparent electrode 203, the common line 205, the pixel electrode 206 and the connection layer 150D. The display device 100D further includes a gate connecting portion 160D and a lead-out connecting portions 170D.

The gate connecting portion 160D and the lead-out connecting portions 170D are formed with the pixel electrode 206 and the connection layer 150D in the step S150. The gate connecting portion 160D is formed of a conductive member which flows into the through-hole 191D. The lead-out connecting portion 170D is formed of a conductive member which flows into the through-hole 192D.

[Eighth Embodiment]

In the seventh embodiment, the conductive portion is formed in the pixel electrode layer including pixel electrodes. The conductive portion may be able to be formed in another layer. In the eighth embodiment, the conductive portion formed in the middle transparent electrode layer including the middle transparent electrode is described.

Figure 23A:
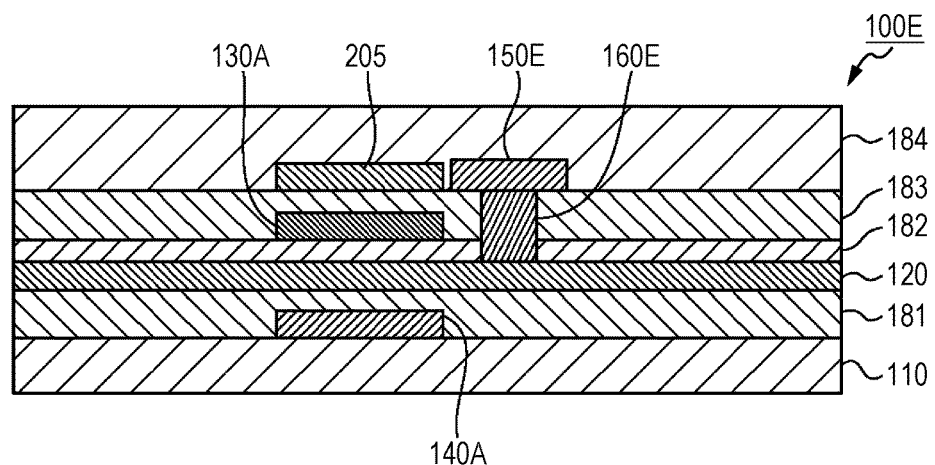
FIG. 23 A is a schematic cross-sectional view of a display device of an eighth embodiment.
Figure 23B:
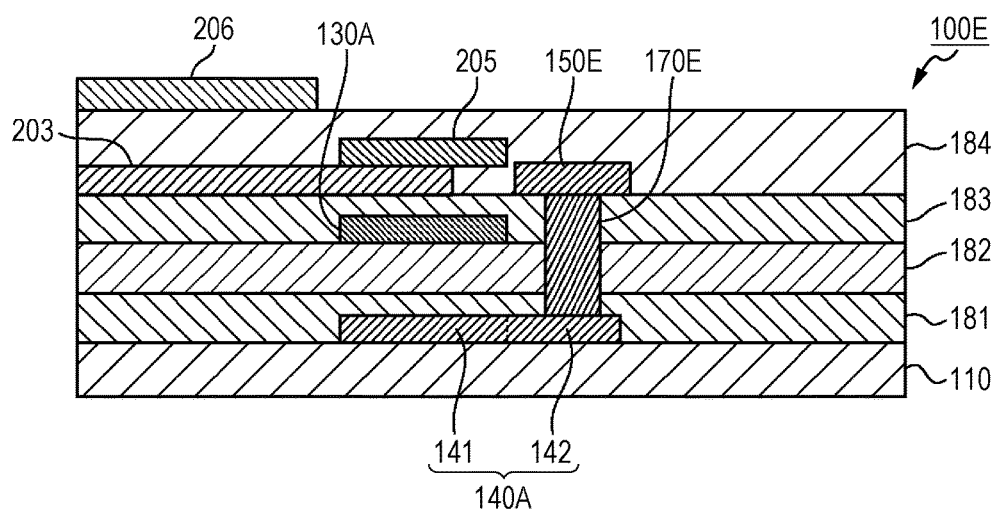

FIG. 23A is a schematic cross-sectional view of a display device 100E in the eighth embodiment. FIG. 23B is another schematic cross-sectional view of the display device 100E. With reference to FIG. 23A and FIG. 23B, the display device 100E is described. The common numeral between the seventh embodiment and the eighth embodiment is labeled on an element which has the same or like functions as that in the seventh embodiment. Thus the description in the seventh embodiment refers to the same element.

Similar to the seventh embodiment, the display device 100E includes the insulating substrate 110, the gate line 120, the source line 130A, the lead-out line 140A, the first insulating layer 181, the second insulating layer 182, the third insulating layer 183, the fourth insulating layer 184, the middle transparent electrode 203, the common lines 205 and the pixel electrodes 206. The display device 100E further includes a connection layer 150E, a gate connecting portion 160E and a lead-out connecting portion 170E. In this embodiment, the middle transparent electrode 203 is exemplified as a common electrode.

Figure 24:
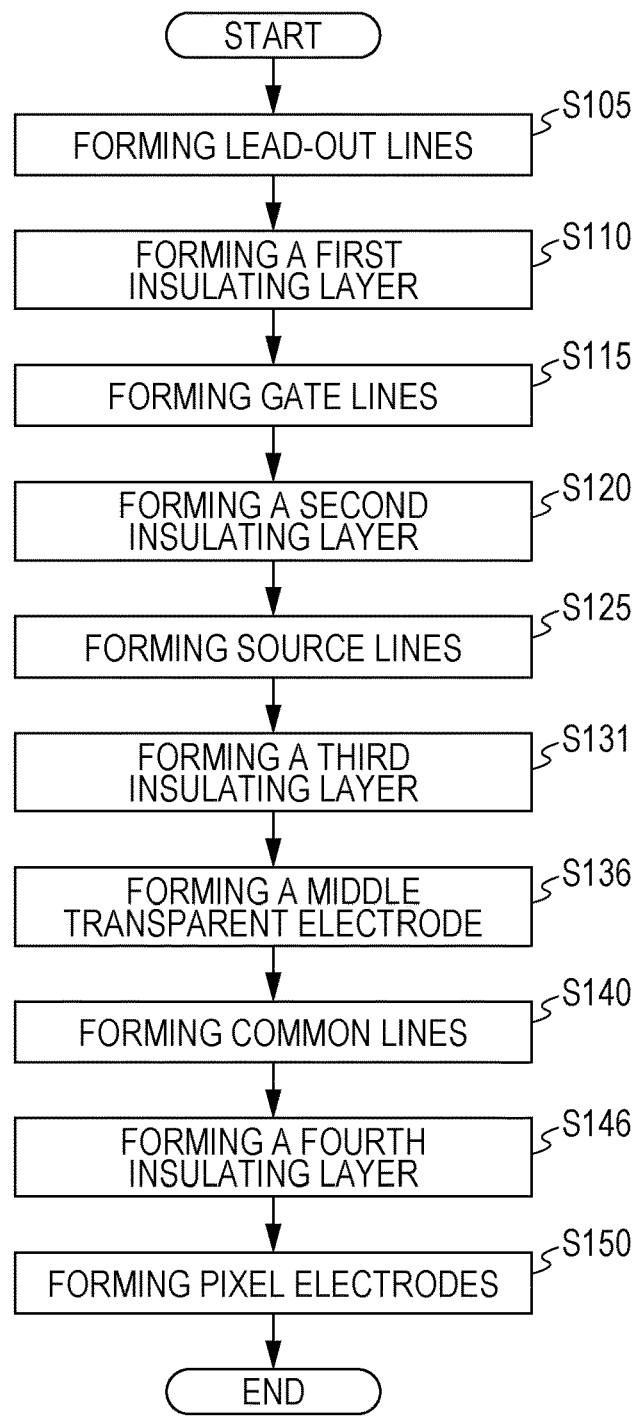
FIG. 24 is a flow chart showing an exemplary laminating process to manufacture the display device shown in FIG. 23A.

FIG. 24 is a flow chart showing an exemplary laminating process to manufacture the display device 100E. With reference to FIG. 23A, FIG. 23B and FIG. 24, the laminating process is described. The common step number between the seventh embodiment and the eighth embodiment is labeled on an element which has the same or like process as that in the seventh embodiment. Thus the description in the seventh embodiment refers to the same element.

Similar to the seventh embodiment, the lead-out lines 140A are formed on the insulating substrate 110 in the step S105. In the step S110, the first insulating layer 181 is laminated. In the step S115, the gate lines 120 are formed on the first insulating layer 181. In the step S120, the second insulating layer 182 is laminated. In the step S125, the source lines 130A are formed extending along the lead-out lines 140A on the second insulating layer 182. Subsequently a step S131 is carried out.

(Step S131)

In the step S131, the third insulating layer 183 is laminated. In a position corresponding to the gate line 120, through-holes are formed in the third insulating layer 183. On positions corresponding to protruding parts 142, through-holes are formed in the third insulating layer 183. Subsequently a step S136 is carried out.

(Step S136)

In the step S136, the middle transparent electrode layer including the middle transparent electrode 203 and connection layers 150E are formed. The middle transparent electrode 203 is formed on the third insulating layer 183 to cover the pixel regions. The connection layers 150E are formed to overlap with the protruding part 142 and the gate line 120. The middle transparent electrode 203 and the connection layers 150E may be formed of the same conductive member. The conductive member flows into through-holes formed at the position corresponding to the gate lines 120, and the gate connecting portions 160E are formed. The conductive member flows into other through-holes formed at the positions corresponding to the protruding parts 42, and the lead-out connecting portions 170E are formed. After the formation of the middle transparent electrode layer, the step S140 is carried out. In this embodiment, the connection layer 150E is exemplified as a first conductive portion.

Similar to the seventh embodiment, in the step S140, the common line 205 is formed along the source line 130A. Subsequently a step S146 is carried out.

(Step S146)

In the step S146, a fourth insulating layer 184 is formed. The fourth insulating layer 184 covers the middle transparent electrode 203 and the common line 205. Subsequently the step S150 is carried out.

Similar to the seventh embodiment, the pixel electrode layer including pixel electrodes 206 is formed in the step S150. As a result, the middle transparent electrode 203 faces the pixel electrodes 206. The brightness of the pixel region is determined depending on a potential difference between the pixel electrode 206 and the middle transparent electrode 203.

[Ninth Embodiment]

In the eighth embodiment, the common lines are laminated after the formation of the middle transparent electrode layer. The common lines may be able to be formed on the same layer as the lead-out lines. In the ninth embodiment, a display device with the common lines formed on the same layer as the lead-out lines is described.

Figure 25A:
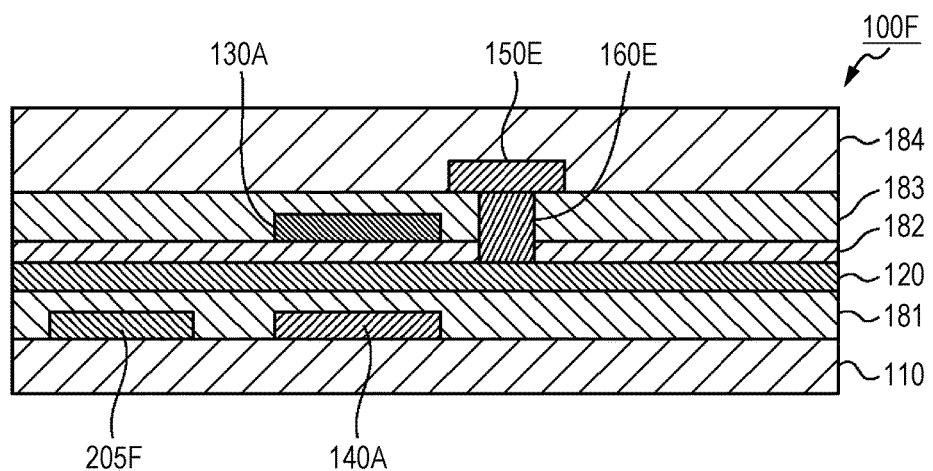
FIG. 25 A is a schematic cross-sectional view of a display device of a ninth embodiment.
Figure 25B:
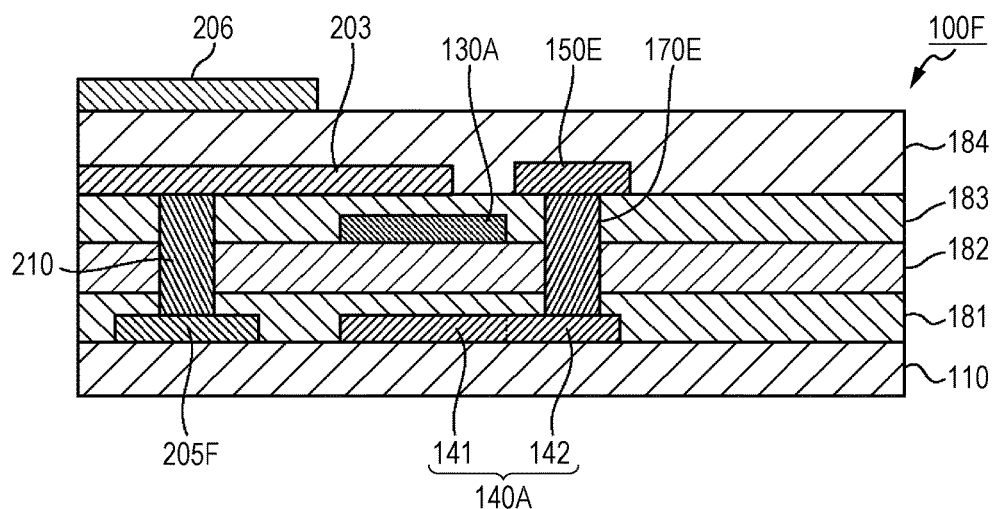

FIG. 25A is a schematic cross-sectional view of a display device 100F of the ninth embodiment. FIG. 25B is another schematic cross-sectional view of the display device 100F. With reference to FIG. 25A and FIG. 25B, the display device 100F is described. The common numeral between the eighth embodiment and the ninth embodiment is labeled on an element which has the same or like functions as that in the eighth embodiment. Thus the description in the eighth embodiment refers to the same element.

Similar to the eighth embodiment, the display device 100F includes the insulating substrate 110, the gate lines 120, the source lines 130A, the lead-out lines 140A, the first insulating layer 181, the second insulating layer 182, the third insulating layer 183, the fourth insulating layer 184, the middle transparent electrode 203, the pixel electrode 206, the gate connecting portion 160E, the lead-out connecting portion 170E and the connection layer 150E. The display device 100F further includes a common line 205F and a common connecting portion 210. The common connecting portion 210 connects between the middle transparent electrode 203 and the common line 205F. The common connecting portion 210 is used for an electrical connection between the middle transparent electrode 203 and the common line 205F.

Figure 26:
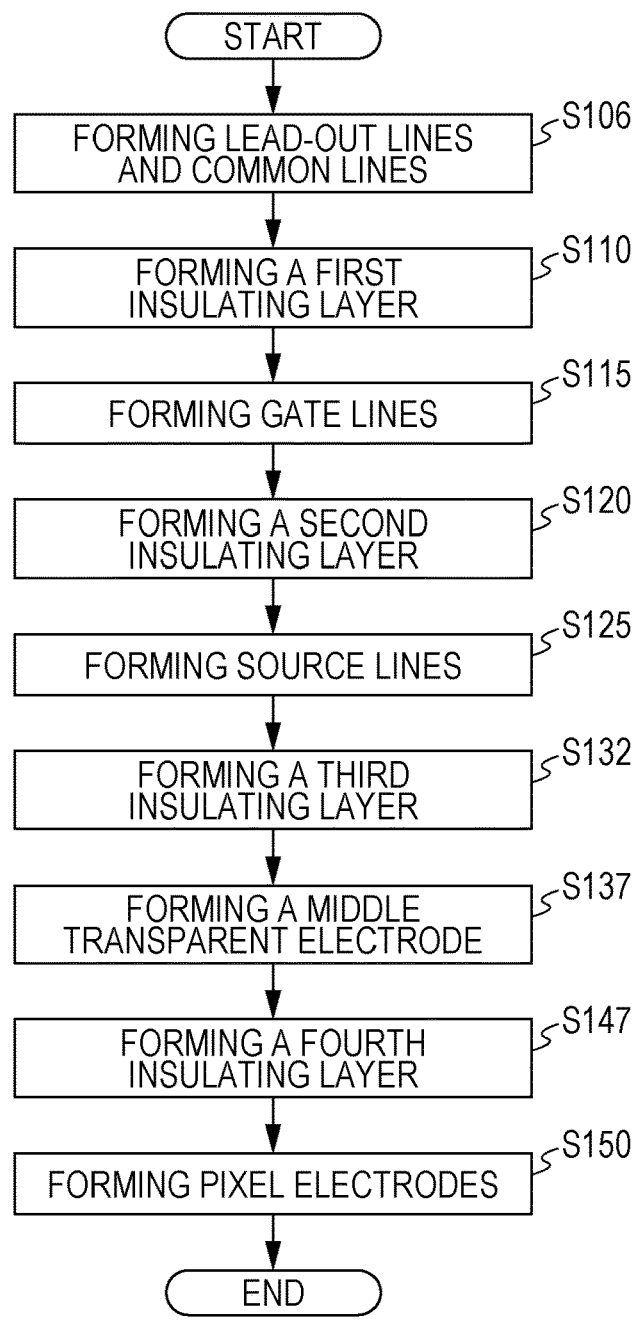
FIG. 26 is a flow chart showing an exemplary laminating process to manufacture the display device shown in FIG. 25A.

FIG. 26 is a flow chart showing an exemplary laminating process to manufacture the display device 100F. With reference to FIG. 25A, FIG. 25B and FIG. 26, the laminating process is described. The common step number between the seventh or eighth embodiment and the ninth embodiment is labeled on an element which has the same or like process as that in the seventh or eighth embodiment. Thus the description in the seventh or eighth embodiment refers to the same element.

(Step S106)

In a step S106, the insulating substrate 110 is prepared. Subsequently the lead-out lines 140A and the common lines 205F are formed on the insulating substrate 110. Similar to the lead-out lines 140A, the common lines 205F extend in the vertical direction. After the formation of the lead-out lines 140A and the common line 205F, the step S110 is carried out.

Similar to the eighth embodiment, in the step S110, the first insulating layer 181 is laminated. In the step S115, the gate lines 120 are formed on the first insulating layer 181. In the step S120, the second insulating layer 182 is laminated. In the step S125, the source lines 130A are formed extending along the lead-out lines 140A on the second insulating layer 182. Subsequently a step S132 is carried out.

(Step S132)

In the step S132, the third insulating layer 183 is laminated. On positions corresponding to the gate line 120, through-holes are formed in the third insulating layer 183. The through-holes formed on positions corresponding to the gate lines 120 extending through the second insulating layer 182 and the third insulating layer 183, and expose parts of the gate lines 120. On positions corresponding to the protruding parts 142, through-holes are formed in the third insulating layer 183. The through-holes formed on positions corresponding to the protruding parts 142 runs through the first insulating layer 181, the second insulating layer 182 and the third insulating layer 183 and expose parts of protruding parts 142. On positions corresponding to the common lines 205F, through-holes are formed in the third insulating layer 183. The through-holes formed at positions corresponding to the common lines 205F run through the first insulating layer 181, the second insulating layer 182 and the third insulating layer 183, and expose parts of common lines 205F. Subsequently a step S137 is carried out.

(Step S137)

In the step S137, the middle transparent electrode layer including the middle transparent electrode 203 is formed. The middle transparent electrode 203 is formed on the third insulating layer 183 to cover the pixel regions. The connection layer 150E is formed to overlap the protruding parts 142 and the gate lines 120. The middle transparent electrode 203 and connection layer 150E may be formed of the same conductive member. The conductive member used for the formation of connection layer 150E flows into through-holes formed at positions corresponding to the gate lines 120, and the gate connecting portions 160E are formed. The conductive member used for the formation of the connection layers 150E partially flows into through-holes formed at the positions corresponding to the protruding parts 142, and the lead-out connecting portions 170E are formed. The conductive member used for the formation of the middle transparent electrode 203 flows into through-holes formed at the positions corresponding to common lines 205F, and the common connecting portions 210 are formed. After the formation of the middle transparent electrode layer, a step S147 is carried out.

(Step S147)

In the step S147, the fourth insulating layer 184 is formed. The fourth insulating layer 184 covers the middle transparent electrode 203. Subsequently the step S150 is carried out.

Similar to the eighth embodiment, in the step S150, the pixel electrode layer including the pixel electrodes 206 is formed. As a result, the middle transparent electrode 203 faces the pixel electrodes 206. The brightness in a pixel region is determined in accordance with a difference of an electric potential difference between the pixel electrode 206 and the middle transparent electrode 203.

[Tenth Embodiment]

The electrical connection technology between the common lines and the middle transparent electrode described in the ninth embodiment is applied to the laminating structure described in the fourth embodiment. In the tenth embodiment, another display device with the common line formed on the same layer as the lead-out lines is described.

Figure 27A:
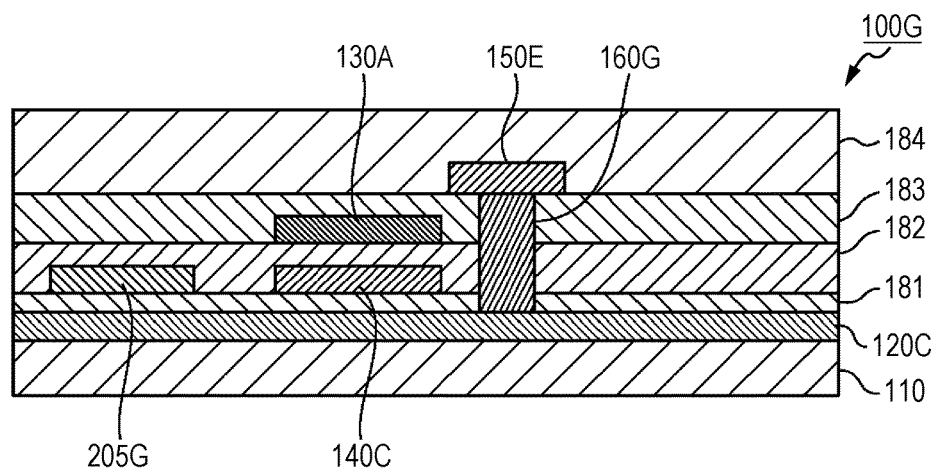
FIG. 27 A is a schematic cross-sectional view of a display device of a tenth embodiment.
Figure 27B:
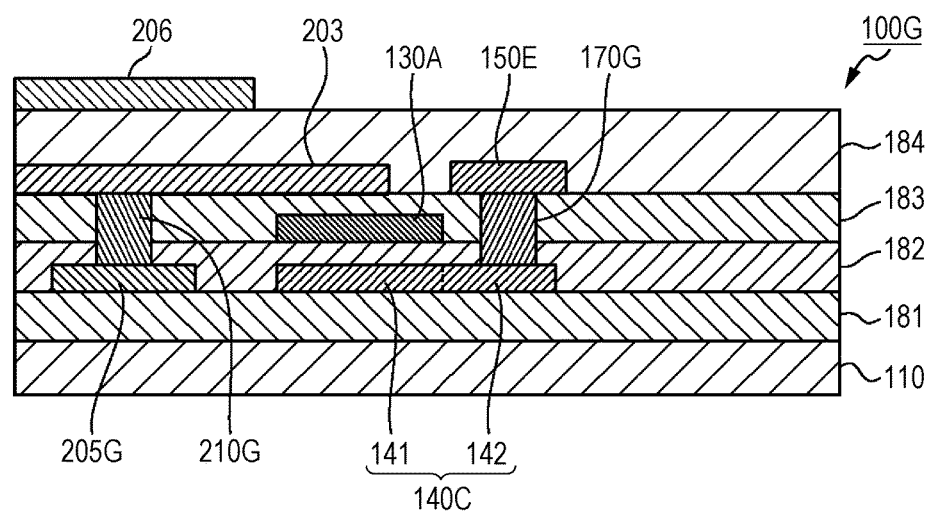

FIG. 27A is a schematic cross-sectional view of a display device 100G in the tenth embodiment. FIG. 27 B is another schematic cross-sectional view of the display device 100G. With reference to FIG. 27A and FIG. 27B, the display device 100G is described. The common numeral between the fourth or ninth embodiment and the tenth embodiment is labeled on an element which has the same or like functions as that in the fourth or ninth embodiment. Thus the description in the fourth or ninth embodiment refers to the same element.

Similar to the fourth embodiment, the display device 100G includes the insulating substrate 110, the gate lines 120C, the source lines 130A, the lead-out lines 140C, the first insulating layer 181, the second insulating layer 182 and the third insulating layer 183. Similar to the ninth embodiment, the display device 100G includes the fourth insulating layer 184, the middle transparent electrode 203, the pixel electrodes 206 and the connection layer 150E.

The display device 100G further includes a gate connecting portion 160G, a lead-out connecting portions 170G, a common connecting portion 210G and a common line 205G. The gate connecting portion 160G connects between the connection layer 150E formed on the third insulating layer 183 and the gate line 120C formed on the insulating substrate 110. The Lead-out connecting portions 170G connects between the connection layers 150E and the protruding parts 142 of the lead-out lines 140C formed on the first insulating layer 181. The lead-out connecting portions 170G, the connection layer 150E and the gate connecting portions 160G are used for transmission of gate signals from the lead-out line 140C to the gate line 120C. The common connecting portion 210G connects between the middle transparent electrode 203 formed on the third insulating layer 183 and the common line 205G formed on the first insulating layer 181. The common connecting portions 210G are used for electrical connection between the middle transparent electrode 203 and the common line 205G.

Figure 28:
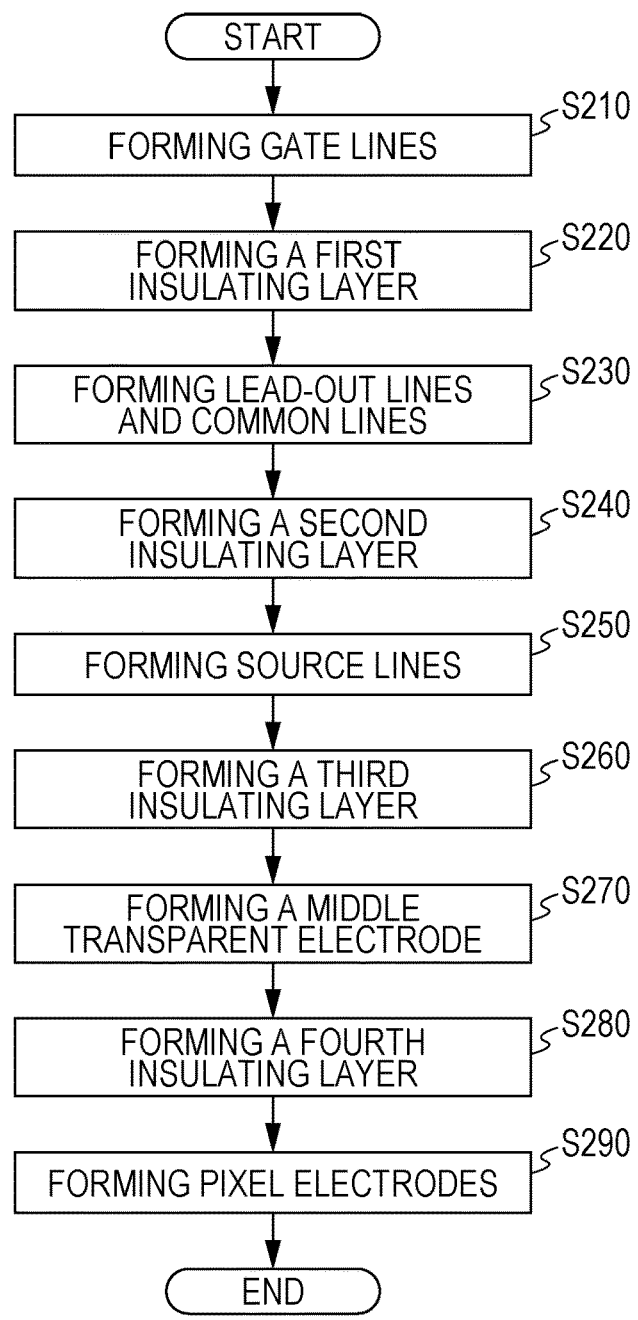
FIG. 28 is a flow chart showing an exemplary laminating process to manufacture the display device shown in FIG. 27A.

FIG. 28 is a flow chart showing an exemplary laminating process to manufacture the display device 100G. With reference to FIG. 27A, FIG. 27B, FIG. 28, a laminating process is described.

(Step S210)

In a step S210, the insulating substrate 110 is prepared. Subsequently gate lines 120C are formed on the insulating substrate 110. A step S220 is carried out afterwards.

(Step S220)

In the step S220, the first insulating layer 181 is laminated. The first insulating layer 181 covers the insulating substrate 110 and the gate lines 120C. Subsequently a step S230 is carried out.

(Step S230)

In the step S230, the lead-out lines 140C and the common lines 205G are formed on the first insulating layer 181. The first insulating layer 181 insulates the gate lines 120C from the lead-out lines 140C and the common line 205G properly. Subsequently a step S240 is carried out.

(Step S240)

In the step S240, the second insulating layer 182 is laminated. The second insulating layer 182 covers the first insulating layer 181, the lead-out lines 140C and the common lines 205G. After the formation of the second insulating layer 182, a step S250 is carried out.

(Step S250)

In the step S250, the source lines 130A are formed on the second insulating layer 182 along the lead-out lines 140C or the common lines 205G. As a result, the second insulating layer 182 is formed between the source lines 130A and the lead-out lines 140C or the common lines 205G. The second insulating layer 182 insulates the source lines 130A from the lead-out lines 140C or the common lines 205G properly. After the formation of the second insulating layer 182, a step S260 is carried out.

(Step S260)

In the step S260, the third insulating layer 183 is further laminated. On positions corresponding to gate lines 120C, through-holes are formed in the third insulating layer 183. The through-holes formed at positions corresponding to gate lines 120C run through the first insulating layer 181, the second insulating layer 182 and the third insulating layer 183, and expose parts of the gate line 120C. In positions corresponding to the protruding parts 142, the through-holes are formed in the third insulating layer 183. The through-holes formed at positions corresponding to protruding parts 142 run through the second insulating layer 182 and the third insulating layer 183 and expose parts of the protruding part 142. In positions corresponding to the common lines 205G, through-holes are formed in the third insulating layer 183. The through-holes formed at positions corresponding to the common lines 205G run through the second insulating layer 182 and the third insulating layer 183, and expose parts of common lines 205G. Subsequently a step S270 is carried out.

(Step S270)

In the step S270, the middle transparent electrode layer including the middle transparent electrode 203 is formed. The middle transparent electrode 203 is formed on the third insulating layer 183 to cover the pixel regions. The connection layer 150E is formed to overlap the protruding parts 142 and the gate lines 120. The middle transparent electrode 203 and the connection layer 150E may be formed of the same conductive member. The conductive member used for the formation of the connection layer 150E flows into the through-holes formed on positions corresponding to the gate lines 120, and the gate connecting portions 160G are formed. The conductive member used for the formation of the connection layer 150E flows into the through-holes formed at positions corresponding to the protruding parts 142, and the lead-out connecting portions 170G are formed. The conductive member used for the formation of the middle transparent electrode 203 flows into the through-holes formed on positions corresponding to common lines 205G, and the common connecting portions 210G are formed. After the formation of the middle transparent electrode layer, a step S280 is carried out.

(Step S280)

In the step S280, the fourth insulating layer 184 is formed. The fourth insulating layer 184 covers the middle transparent electrode 203. Subsequently a step S290 is carried out.

(Step S290)

In the step S290, a pixel electrode layer including the pixel electrodes 206 is formed. As a result, the middle transparent electrode 203 faces the pixel electrodes 206. The brightness in the pixel region is determined in accordance with a difference in an electric potential between the pixel electrode 206 and the middle transparent electrode 203.

[Eleventh Embodiment]

The pixel electrodes electrically connect to the transistors as described in the seventh embodiment. Therefore, through-holes are formed before the formation of the pixel electrode layer. When through-holes for an electrical connection between the common lines and the middle transparent electrode, and other through-holes for electrical connection between the lead-out lines and the gate lines are formed in the same step of a forming process of through-holes for an electrical connection of the pixel electrode, the display device can be manufactured by a small number of steps of a manufacturing process. In the eleventh embodiment, a display device whose through-holes can be formed at one step is described.

Figure 29A:
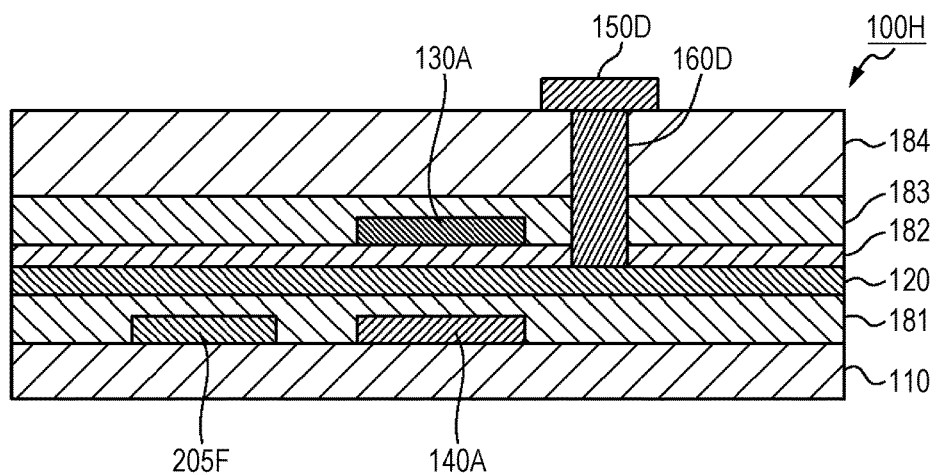
FIG. 29 A is a schematic cross-sectional view of a display device of an eleventh embodiment.
Figure 29B:
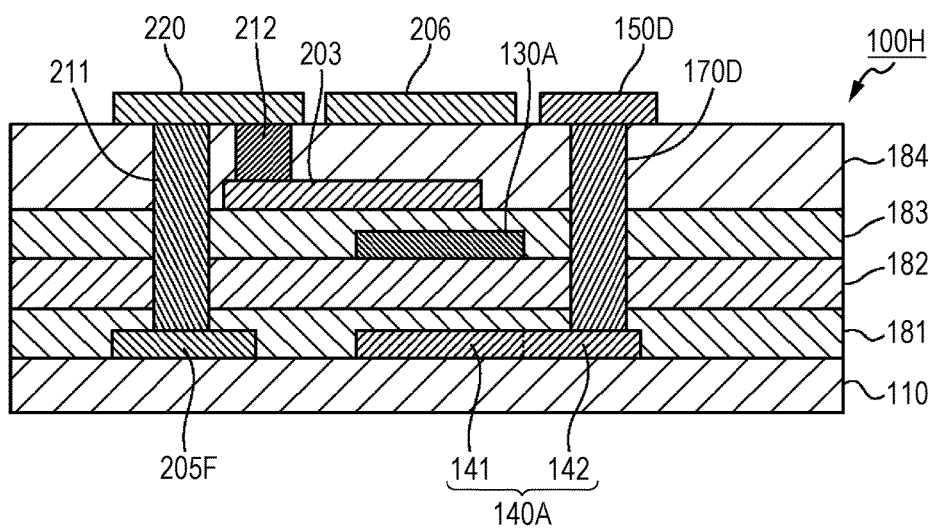

FIG. 29A is a schematic cross section of a display device 100H of the eleventh embodiment. FIG. 29B is schematic other cross sections of the display device 100H. With reference to FIG. 29A and FIG. 29B, the display device 100H is described. The common numeral between the seventh or ninth embodiment and the eleventh embodiment is labeled on an element which has the same or like functions as that in the seventh or ninth embodiment. Thus the description in the seventh or ninth embodiment refers to the same element.

Similar to the seventh embodiment, the display device 100H includes the insulating substrate 110, the gate lines 120, the source lines 130A, the lead-out lines 140A, the first insulating layer 181, the second insulating layer 182, the third insulating layer 183, the fourth insulating layer 184, the middle transparent electrode 203, the pixel electrodes 206, the gate connecting portions 160D, the lead-out connecting portions 170D and the connection layers 150D. Similar to the ninth embodiment, the display device 100H further includes common lines 205F.

The display device 100H further includes first common connecting portion 211, second common connecting portions 212 and connection layers 220. The middle transparent electrode 203 is formed on the third insulating layer 183 described in the seventh embodiment. Subsequently the fourth insulating layer 184 is formed on the third insulating layer 183 and covers middle transparent electrode 203 and the third insulating layer 183. After the formation of the fourth insulating layer 184, through-holes are formed by photoresist technology. These through-holes are used for not only the formation of the electrical connection between the pixel electrodes 206 and the transistors (in reference with the seventh embodiment) but also the formation of the gate connecting portions 160D, the lead-out connecting portions 170D, the first common connecting portions 211 and the second common connecting portions 212.

Through-holes used for the formation of the gate connecting portion 160D run through the second insulating layer 182, the third insulating layer 183 and fourth insulating layer 184, and expose parts of the gate lines 120. Through-holes used for the formation of the lead-out connecting portions 170D runs through the first insulating layer 181, the second insulating layer 182, the third insulating layer 183 and the fourth insulating layer 184, and expose parts of the protruding parts 142. Through-holes used for the formation of the first common connecting portion 211 run through the first insulating layer 181, the second insulating layer 182, the third insulating layer 183 and the fourth insulating layer 184, and expose parts of the middle transparent electrode 203.

After the formation of the through-holes, the pixel electrodes 206, the connection layer 150D, 220 are formed on fourth insulating layer 184 in the pixel electrode layer. The pixel electrodes 206 electrically connect to the elements such as the transistors via the through-holes described in the seventh embodiment.

The conductive member used for the formation of the connection layer 150D partially flows into through-holes which expose the gate lines 120, and forms the gate connecting portions 160D. And the conductive member used for the formation of connection layer 150D partially flows into through-holes which expose the protruding parts 142, and forms the lead-out connecting portions 170D.

The connection layer 220 covers at least a part of common line 205F and at least a part of the middle transparent electrode 203. The conductive member used for the formation of connection layer 220 partially flows into through-holes which expose the common lines 205F, and forms the first common connecting portions 211. The conductive member used for the formation of connection layer 220 partially flows into through-holes which expose the middle transparent electrode 203 formed between the third insulating layer 183 and the fourth insulating layer 184, and forms the second common connecting portions 212. As a result, the common lines 205F electrically connect to the middle transparent electrode 203 through the first common connecting portions 211, the connection layers 220 and the second common connecting portions 212. In this embodiment, the connection layer 220 is exemplified as a second conductive portion.

Figure 30:
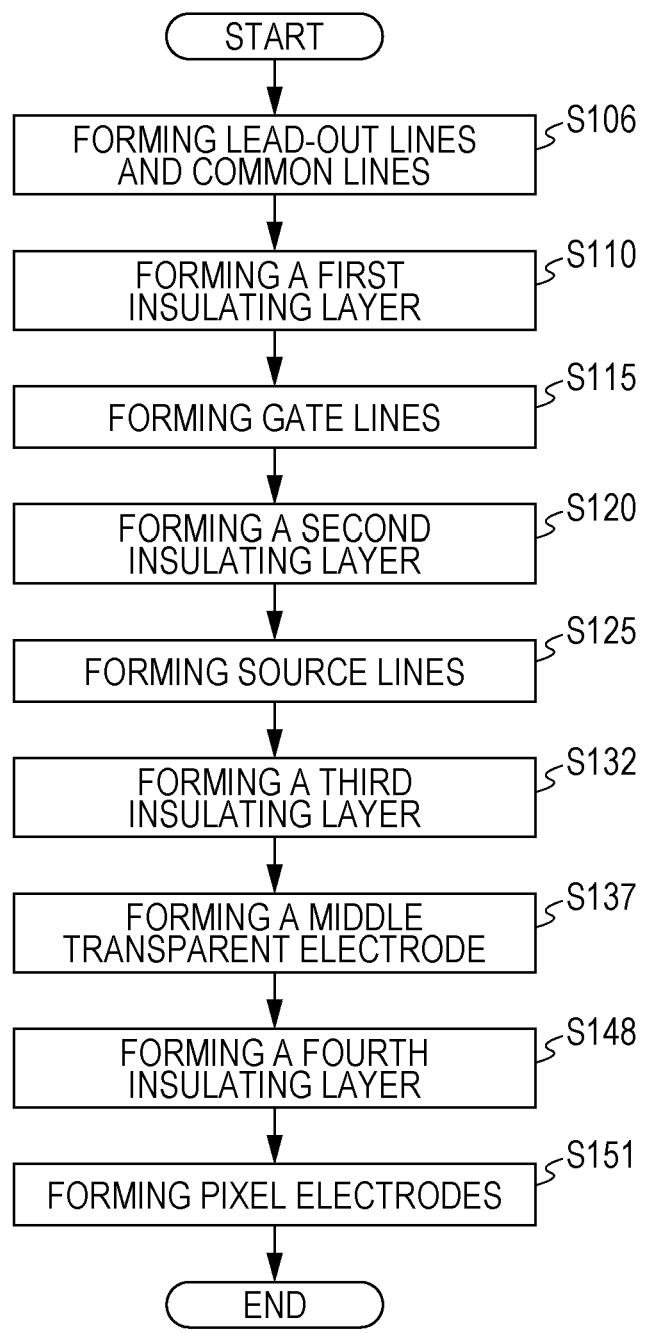
FIG. 30 is a flow chart showing an exemplary laminating process to manufacture the display device shown in FIG. 29A.

FIG. 30 is a flow chart showing an exemplary laminating process to manufacture a display device 100H. With reference to FIG. 29A, FIG. 29B and FIG. 30, a laminating process is described. The common step number between the ninth embodiment and the eleventh embodiment is labeled on an element which has the same or like process as that in the ninth embodiment. Thus the description in the ninth embodiment refers to the same element.

Similar to the ninth embodiment, the insulating substrate 110 is prepared in the step S106. Subsequently the lead-out lines 140A and the common lines 205F are formed on the insulating substrate 110. Thus, the lead-out lines 140A and the common lines 205F are formed in the same layer. Similar to the lead-out lines 140A, the common lines 205F extend in the vertical direction. After the formation of the lead-out lines 140A and the common lines 205F, the step S110 is carried out. In this embodiment, the step S106 is exemplified as a step of forming common lines.

Similar to the eighth embodiment, the first insulating layer 181 is laminated in the step S110. In the step S115, the gate lines 120 are formed on the first insulating layer 181. In the step S120, the second insulating layer 182 is laminated. In the step S125, the source lines 130A are formed on the second insulating layer 182 extending along the lead-out lines 140A. In the step S132, the third insulating layer 183 is laminated. In the step S137, the middle transparent electrode layer including the middle transparent electrode 203 is formed. Subsequently a step S148 is carried out.

(Step S148)

In the step S148, the fourth insulating layer 184 is formed. The fourth insulating layer 184 covers the middle transparent electrode 203 and the third insulating layer 183.

On positions corresponding to the gate lines 120, through-holes are formed in the fourth insulating layer 184. The through-holes formed on positions corresponding to the gate lines 120 run through the second insulating layer 182, the third insulating layer 183 and the fourth insulating layer 184 towards the gate lines 120. As a result, parts of the gate lines 120 are exposed. In this embodiment, the through-hole formed on a position corresponding to the gate line 120 is exemplified as a first through-hole.

On positions corresponding to the protruding parts 142, the through-holes are formed in the fourth insulating layer 184. The through-holes formed on positions corresponding to the protruding parts 142 run through the first insulating layer 181, the second insulating layer 182, the third insulating layer 183 and the fourth insulating layer 184 towards the protruding parts 142. As a result, at least parts of protruding parts 142 are exposed. In this embodiment, the through-hole formed on a position corresponding to the protruding part 142 is exemplified as a second through-hole.

On positions corresponding to the common lines 205F, through-holes are formed in the fourth insulating layer 184. The through-holes formed on positions corresponding to common lines 205F run through the first insulating layer 181, the second insulating layer 182, the third insulating layer 183 and the fourth insulating layer 184 towards common lines 205F. As a result, parts of common lines 205F are exposed. In this embodiment, the through-hole formed on position corresponding to the common line 205F is exemplified as a fourth through-hole.

On positions corresponding to the middle transparent electrode 203, the through-holes are formed in the fourth insulating layer 184. The through-holes formed on positions corresponding to the middle transparent electrode 203 run through the fourth insulating layer 184 towards the middle transparent electrode 203. As a result, parts of middle transparent electrode 203 are exposed. Subsequently a step S151 is carried out. In this embodiment, the through-hole formed on a position corresponding to the middle transparent electrode 203 is exemplified as a third through-hole.

The step S148 is exemplified as a through-hole step including a step for forming the first through-hole, the second through-hole, the third through-hole and the fourth through-hole in insulating layers at a same time.

(Step S151)

In the step S151, the pixel electrode layer including the pixel electrodes 206 and the connection layers 150D, 220 are formed. The conductive member used for the formation of the connection layer 150D partially flows into through-holes which expose the gate lines 120, and forms the gate connecting portions 160D. And the conductive member used for the formation of connection layer 150D partially flows into through-holes which expose the protruding parts 142, and forms the lead-out connecting portions 170D.

The conductive member used for the formation of connection layer 220 partially flows into through-holes which expose the common lines 205F, and forms the first common connecting portions 211. The connection layer 220 electrically connects to common lines 205F via the first common connecting portions 211.

The conductive member used for the formation of connection layer 220 partially flows into through-holes which expose the middle transparent electrode 203 formed between the third insulating layer 183 and the fourth insulating layer 184, and forms the second common connecting portions 212. The connection layers 220 electrically connect to the middle transparent electrode 203 via the second common connecting portions 212.

Based on the principle of above-mentioned various embodiments, those skilled in the art can perform various changes, improvement and abbreviation. For example, in the above-mentioned embodiments, the first insulating layer is formed on the insulating substrate. The principles in the above-mentioned embodiments include the first insulating layer laminated not only on the insulating substrate directly but also on the layer which is formed between the insulating substrate and the first insulating layer. In other words, in the above-mentioned explanation, the term "is laminated on" and its similar term may be interpreted as "is laminated after".

Note that the specific embodiments described above mainly include the illustrative embodiments having the following configuration.

In one general aspect, the instant application describes a display device displaying an image in a display area in accordance with image signals. The display device includes an insulating substrate, a gate line extending in a first direction on the insulating substrate, a source line extending in a second direction which is different from the first direction on the insulating substrate, a lead-out line extending in the second direction so as to transmit gate signals to the gate line, a first conductive portion covering at least a part of the gate line and at least a part of the lead-out line, a gate connecting portion connecting the gate line and the first conductive portion and a lead-out connecting portion connecting the lead-out line and the first conductive portion.

According to the foregoing configuration, the gate line is connected to the lead-out line through the first conductive portion by the gate connecting portion and the lead-out connecting portion. Because the gate connecting portion and the lead-out connecting portion can be formed in a process of forming the first conductive portion, the display device can be manufactured under a small number of steps of manufacturing process.

The above general aspect may include one or more of the following features. The source line may overlap with at least a part of the lead-out lines in plan view. The lead-out line may include a line portion transmitting gate signals in the second direction and a protruding portion protruding in the first direction from the line portion. The lead-out connecting portion may connect between the protruding portion and the first conductive portion.

According to the foregoing configuration, because the protruding portion is projected in the second direction from the line part which transmits gate signals in the first direction, the lead-out connecting portion is formed easily between the protruding portion and the first conductive portion. Thus, the display device can be manufactured under a small number of steps of manufacturing process.

The display device may further include a first insulating layer formed on the insulating substrate, a second insulating layer formed on the first insulating layer and a third insulating layer formed on the second insulating layer. At least one of the gate line and the lead-out line may be formed between the insulating substrate and the first insulating layer. The other one of the gate line and the lead-out line may be formed between the first insulating layer and the second insulating layer. The source line may be formed between the second insulating layer and the third insulating layer. The first conductive layer may be formed on the third insulating layer.

According to the foregoing configuration, the source lines are insulated from the gate lines or the lead-out lines appropriately by the second insulating layer. Because the first conductive portion is formed on the third insulating layer, the gate connecting portion and the lead-out connecting portion are formed in the step of forming the first conductive portion after the step of forming the third insulating layer. Thus, the display device can be manufactured under a small number of steps of manufacturing process.

The lead-out line may be formed between the insulating substrate and the first insulating layer. The gate line may be formed between the first insulating layer and the second insulating layer. The gate connecting portion may include conductive member in a through hole penetrating the second insulating layer and the third insulating layer. The lead-out connecting portion may include conductive member in a through hole penetrating the first insulating layer, the second insulating layer and the third insulating layer.

According to the foregoing configuration, the lead-out lines are insulated from the gate lines appropriately by the first insulating layer. The source lines are insulated from the gate line appropriately by the second insulating layer. In the step of forming through-holes after the formation of the third insulating layer, the through-holes running through the second insulating layer and the third insulating layer and the through-holes running through the first insulating layer, the second insulating layer and the third insulating layer can be formed. Thus, the gate connecting portion and the lead-out connecting portion are formed in a step of forming the first conductive portion after the formation of the third insulating layer. And the display device can be manufactured under a small number of steps of manufacturing process.

The gate line may be formed between the insulating substrate and the first insulating layer. The lead-out line may be formed between the first insulating layer and the second insulating layer. The lead-out connecting portion may include conductive member in a through hole penetrating the second insulating layer and the third insulating layer. The gate connecting portion may include conductive member in a through hole penetrating the first insulating layer, the second insulating layer and the third insulating layer.

According to the foregoing configuration, the gate lines are insulated from the lead-out lines appropriately by the first insulating layer. The source lines are insulated from the lead-out lines appropriately by the second insulating layer.

In a step of forming through-holes after the formation of the third insulating layer, the through-holes running through the second insulating layer and the third insulating layer and through-holes running through the first insulating layer, the second insulating layer and the third insulating layer can be formed. Thus, the gate connecting portion and the lead-out connecting portion are formed in a step of forming the first conductive portion after the formation of the third insulating layer. Thus the display device can be manufactured under a small number of steps of manufacturing process.

The display device may further include a pixel electrode. The first conductive portion may be formed in a same layer as the pixel electrodes.

According to the foregoing configuration, because the first conductive portion is formed in the pixel electrode layer including the pixel electrodes, the gate connecting portion and the lead-out connecting portion are formed in a step of forming pixel electrodes. Thus the display device can be manufactured under a small number of steps of manufacturing process.

The display device may further include a pixel electrode and a common electrode. The common electrode may be positioned opposing the pixel electrode. The first connecting portion may be formed in a same layer as the common electrode.

According to the foregoing configuration, because the first conductive portion is formed in the common electrode layer, the gate connecting portion and the lead-out connecting portion are formed in a step of forming the common electrode. Thus the display device can be manufactured under a small number of steps of manufacturing process.

The display device may further include a pixel electrode, a common electrode positioned opposing the pixel electrode and a common line electrically connecting to the common electrode. The first conductive portion may be formed in a same layer as the common electrode. The common line may extend in the second direction. The lead-out line and the common line may be formed in a same layer.

According to the foregoing configuration, the lead-out connecting portion which connects the lead-out line to the first conductive portion is formed in a step of forming the common electrode layer. Thus the display device can be manufactured under a small number of steps of manufacturing process.

The display device may further include a common connecting portion connecting the common electrode and the common line. The common connecting portion may include conductive member in a through hole penetrating the first insulating layer, the second insulating layer and the third insulating layer.

According to the foregoing configuration, the common connecting portion and the lead-out connecting portion may be formed in a step of forming the common electrode layer. Thus the display device can be manufactured under a small number of steps of manufacturing process.

The display device may further include a common connecting portion connecting the common electrode and a common line. The common connecting portion may include conductive member in a through hole penetrating the second insulating layer and the third insulating layer.

According to the foregoing configuration, the common connecting portion and the lead-out connecting portion are formed in a step of forming the common electrode layer. Thus the display device can be manufactured under a small number of steps of manufacturing process.

The display device may further include a fourth insulating layer formed on the third insulating layer, a pixel electrode and a common electrode. The common electrode may be formed between the third insulating layer and the fourth insulating layer. The first conductive portion may be formed in a same layer as the pixel electrode.

According to the foregoing configuration, the common connecting portion and the lead-out connecting portion are formed in a step of the common electrode layer. Thus the display device can be manufactured under a small number of steps of manufacturing process.

The display device may further include a common line electrically connecting to the common electrode and a second conductive portion covering at least a part of the common line and the common electrode. The second conductive portion may be formed in a same layer as the pixel electrode. The common electrode and the common line may be electrically connected through the second conductive part. The common line may extend in the second line. The lead-out line and the common line may be formed in a same layer.

According to the foregoing configuration, the common connecting portion and the lead-out connecting portion are formed in a step of forming the common electrode layer. Thus the display device can be manufactured under a small number of steps of manufacturing process.

The common electrode may electrically connect to the second conductive portion through conductive member in a through hole penetrating the fourth insulating layer.

According to the foregoing configuration, the common connecting portion and the lead-out connecting portion may be formed in a step of the common electrode layer. Thus the display device can be manufactured under a small number of steps of manufacturing process.

The common line may electrically connect to the second conductive portion with conductive member in a through hole penetrating the first insulating layer, the second insulating layer, the third insulating layer and the fourth insulating layer.

According to the foregoing configuration, the common connecting portion and the lead-out connecting portion are formed in a step of forming the common electrode layer. Thus the display device can be manufactured under a small number of steps of manufacturing process.

In another general aspect, a method for manufacturing a display device displaying an image in a display area in accordance with image signals. The display device may include a gate line extending in a first direction, a source line extending in a second direction which is different from the first direction, a lead-out line extending in the second direction. The method may include an insulating step for forming insulating layers to insulate the gate line, the source line, and the lead-out line from each other, a through-hole step for forming a first through hole and a second through hole in the insulating layers at a same time, the first through hole running towards the gate line and a second through-hole running towards the lead-out line and a connecting step for providing conductive member into the first through hole and the second through hole and electrically connecting between the gate line and the lead-out lines through the first conductive portion by laminating the first conductive portion on the insulating layers.

According to the foregoing configuration, because the first through-hole and the second through-hole are formed in one step, the display device can be manufactured under a small number of steps of manufacturing process.

The display device may further include a common electrode. The insulating step may include a step for forming an insulating layer between the common electrode and the source line and a step for forming an insulating layer on the common electrode and the connecting step includes a step for forming the first conductive portion in a same layer as the pixel electrode.

According to the foregoing configuration, because the connecting step includes a step to form the first conductive portion in the pixel electrode layer including pixel electrode, the display device can be manufactured under a small number of steps of manufacturing process.

The display device may further include a common line. The through-hole step may include a step for forming a third through hole running towards the common electrode and a fourth through hole running towards the common line at a same time. The connecting step may include a step for providing the conductive member in the third through-hole and electrically connecting between the first conductive portion and the common electrode by laminating the first conductive portion on the insulating layers and a step for providing the conductive member in the fourth through-hole and electrically connecting between the first conductive portion and the common line by laminating the first conductive portion on the insulating layers.

According to the foregoing configuration, because the third through-hole and the fourth through-hole are formed in one step, the display device can be manufactured under a small number of steps of manufacturing process.

The through-hole step may include a step for forming the first through-hole, the second through-hole, the third through-hole and the fourth through-hole in the insulating layers at a same time.

According to the foregoing configuration, because the first through-hole to the fourth through-hole are formed in one step, the display device can be manufactured by a small number of manufacturing steps.

The principles of the above mentioned embodiments can be preferably for a display device that displays pictures.

What is claimed is:

1. A display device displaying an image in a display area in accordance with image signals, the display device comprising:
   an insulating substrate;
   a gate line extending in a first direction on the insulating substrate;
   a source line extending from a first side of the display area to a second side of the display area in a second direction which is different from the first direction on the insulating substrate, the first side and the second side being opposite to each other;
   a lead-out line extending from the first side of the display area to the second side of the display area in the second direction so as to transmit gate signals to the gate line;
   a first conductive portion covering at least a part of the gate line and at least a part of the lead-out line;
   a gate connecting portion connecting the gate line and the first conductive portion; and
   a lead-out connecting portion connecting the lead-out line and the first conductive portion, wherein
   the source line overlaps with at least a part of the lead-out line in a plan view,
   the lead-out line includes;
   a line portion transmitting gate signals in the second direction; and
   a protruding portion protruding in the first direction from the line portion in the display area and the protruding portion being between two ends of the lead-out line, and the first conductive portion extending in the second direction, and the lead-out connecting portion including a conductive member in a through hole provides a direct contact between the protruding portion and the first conductive portion.

2. The display device according to claim 1, further comprising:
a first insulating layer formed on the insulating substrate;
a second insulating layer formed on the first insulating layer; and
a third insulating layer formed on the second insulating layer,
wherein at least one of the gate line and the lead-out line is formed between the insulating substrate and the first insulating layer, and the other one of the gate line and the lead-out line is formed between the first insulating layer and the second insulating layer,
the source line is formed between the second insulating layer and the third insulating layer, and
the first conductive portion is formed on the third insulating layer.

3. The display device according to claim 2, wherein
the lead-out line is formed between the insulating substrate and the first insulating layer,
the gate line is formed between the first insulating layer and the second insulating layer,
the gate connecting portion includes a conductive member in a through hole penetrating the second insulating layer and the third insulating layer, and
the lead-out connecting portion includes the conductive member in the through hole penetrating the first insulating layer, the second insulating layer and the third insulating layer.

4. The display device according to claim 3, further comprising:
pixel electrodes; and
a common electrode, wherein the common electrode is positioned opposing the pixel electrode electrodes, and the first connecting portion is formed in a same layer as the common electrode.

5. The display device according to claim 3, further comprising: pixel electrodes; a common electrode positioned opposing the pixel electrodes; and a common line electrically connecting to the common electrode, wherein the first conductive portion is formed in a same layer as the common electrode, the common line extends in the second direction, and the lead-out line and the common line are formed in a same layer.

6. The display device according to claim 5, further comprising:
a common connecting portion connecting the common electrode and the common line,
wherein the common connecting portion includes a conductive member in a through hole penetrating the first insulating layer, the second insulating layer and the third insulating layer.

7. The display device according to claim 2, wherein
the gate line is formed between the insulating substrate and the first insulating layer, the lead-out line is formed between the first insulating layer and the second insulating layer,
the lead-out connecting portion includes the conductive member in the through hole penetrating the second insulating layer and the third insulating layer, and
the gate connecting portion includes a conductive member in a through hole penetrating the first insulating layer, the second insulating layer and the third insulating layer.

8. The display device according to claim 7, further comprising: pixel electrodes; a common electrode positioned opposing the pixel electrodes; and a common line electrically connecting to the common electrode, wherein the first conductive portion is formed in a same layer as the common electrode, the common line extends in the second direction, and the lead-out line and the common line are formed in a same layer.

9. The display device according to claim 8, further comprising: a common connecting portion connecting the common electrode and a common line, wherein the common connecting portion includes a conductive member in a through hole penetrating the second insulating layer and the third insulating layer.

10. The display device according to claim 2, further comprising:
a fourth insulating layer formed on the third insulating layer; pixel electrodes; and
a common electrode,
wherein the common electrode is formed between the third insulating layer and the fourth insulating layer and the first conductive portion is formed in a same layer as the pixel electrodes.

11. The display device according to claim 10, further comprising:
a common line electrically connecting to the common electrode; and a second conductive portion covering at least a part of the common line and the common electrode and being formed in a same layer as the pixel electrodes;
wherein the common electrode and the common line are electrically connected through the second conductive portion,
the common line extends in the second direction, and
the lead-out line and the common line are formed in a same layer.

12. The display device according to claim 11, wherein
the common electrode electrically connects to the second conductive portion through a conductive member in a through hole penetrating the fourth insulating layer.

13. The display device according to claim 11, wherein
the common line electrically connects to the second conductive portion with a conductive member in a through hole penetrating the first insulating layer, the second insulating layer, the third insulating layer and the fourth insulating layer.

14. The display device according to claim 1, further comprising pixel electrodes, wherein
the first conductive portion is formed in a same layer as the pixel electrodes.

* * * * *